(12) United States Patent
Takahashi et al.

(10) Patent No.: US 9,634,226 B2
(45) Date of Patent: Apr. 25, 2017

(54) LAMB WAVE DEVICE AND MANUFACTURING METHOD THEREOF

(71) Applicant: TAIYO YUDEN CO., LTD., Tokyo (JP)

(72) Inventors: Tomoyuki Takahashi, Tokyo (JP); Taisei Irieda, Tokyo (JP); Kentaro Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 310 days.

(21) Appl. No.: 13/911,994

(22) Filed: Jun. 6, 2013

(65) Prior Publication Data

US 2014/0009032 A1 Jan. 9, 2014

(30) Foreign Application Priority Data

Jul. 4, 2012 (JP) ................................. 2012-150295

(51) Int. Cl.

| H01L 41/053 | (2006.01) |
| H01L 41/29 | (2013.01) |
| H03H 9/02 | (2006.01) |
| H03H 9/05 | (2006.01) |

(52) U.S. Cl.

CPC ............ *H01L 41/053* (2013.01); *H01L 41/29* (2013.01); *H03H 9/02228* (2013.01); *H03H 9/02559* (2013.01); *H03H 9/059* (2013.01); *Y10T 29/42* (2015.01)

(58) Field of Classification Search

CPC ............ H03H 9/6433; H03H 9/14517; H03H 9/1452; G06G 7/195

USPC .............................. 310/313 B, 313 C, 313 D
See application file for complete search history.

(56) References Cited

U.S. PATENT DOCUMENTS

| 5,283,037 A * | 2/1994 | Baer .................... G01N 29/022 |
| | | 310/311 |
| 6,842,091 B2 * | 1/2005 | Yip ..................... H03H 9/02685 |
| | | 310/313 D |
| 7,484,279 B2 * | 2/2009 | Aoki ..................... H03H 9/0547 |
| | | 29/25.35 |
| 7,965,015 B2 * | 6/2011 | Tai et al. .................. 310/313 R |

(Continued)

FOREIGN PATENT DOCUMENTS

| JP | 2008-98974 A | 4/2008 |
| JP | 2010-220204 A | 9/2010 |

*Primary Examiner* — Shawki S Ismail
*Assistant Examiner* — Bryan Gordon
(74) *Attorney, Agent, or Firm* — Chen Yoshimura LLP

(57) ABSTRACT

A Lamb wave device according to an embodiment of the present invention includes a piezoelectric function member and a supporting member. The piezoelectric function member has a piezoelectric substrate, IDT electrodes, and a cutout portion. The IDT electrodes are disposed on the upper surface of the piezoelectric substrate. The cutout portion is formed in the piezoelectric substrate, and includes a step face provided between the upper surface and the lower surface of the piezoelectric substrate. The supporting member has a supporting surface and a cavity. The supporting surface is bonded to the lower surface of the piezoelectric substrate, and is exposed in the cutout portion toward the upper surface of the piezoelectric substrate. The cavity is formed adjacent to the supporting surface, and faces the IDT electrodes through the piezoelectric substrate.

18 Claims, 21 Drawing Sheets

(56) References Cited

U.S. PATENT DOCUMENTS

| | | | | |
|---|---|---|---|---|
| 2004/0222717 | A1* | 11/2004 | Matsuda | H03H 3/08 310/313 R |
| 2007/0188047 | A1* | 8/2007 | Tanaka | 310/313 D |
| 2010/0253182 | A1* | 10/2010 | Takada | H03H 9/1092 310/313 B |
| 2011/0266918 | A1* | 11/2011 | Iwamoto | H03H 3/08 310/313 B |

* cited by examiner

LAMB WAVE DEVICE AND MANUFACTURING METHOD THEREOF

This application claims the benefit of Japanese Patent Application No. 2012-150295, filed in Japan on Jul. 4, 2012, which is hereby incorporated by reference in its entirety.

BACKGROUND OF THE INVENTION

Field of the Invention

The present invention relates to a Lamb wave device that uses Lamb waves, and to a method of manufacturing same.

Description of Related Art

Surface acoustic wave (SAW) filters and film bulk acoustic resonators (FBAR) are used in mobile phones to transmit and receive radio waves. SAW filters are mainly used for a frequency range of 3 GHz or lower, for example, and FBARs are mainly used for a frequency range of 1.6 GHz or higher, for example. Because next generation mobile phones use radio waves in the 3.5 GHz band, filter devices used for such next generation mobile phones are required to be able to handle a higher frequency than conventional filters (2 GHz band). In order to meet such demands, Lamb wave devices have been developed.

Similar to surface acoustic waves, Lamb waves are excited by IDT (interdigital transducer) electrodes formed on a piezoelectric substrate. Lamb waves and SAW differ from each other in that the SAW is propagated on the substrate surface and the Lamb waves are propagated by repeatedly reflecting off of the upper surface and the lower surface of the substrate. In Lamb wave devices, the thinner the piezoelectric substrate is, the faster the propagation speed becomes. For example, when the thickness of the piezoelectric substrate is 1 μm or less, the propagation speed of Lamb waves is 6000 m/s or higher, while the propagation speed of SAW is about 4000 m/s.

In Lamb wave devices, the thickness of the piezoelectric substrate largely affects the propagation speed. A change in the thickness of the piezoelectric substrate causes the propagation speed to change, and as a result, a resonance frequency changes. Therefore, in order to obtain desired resonance characteristics, it is necessary to control the thickness of the piezoelectric substrate with a higher degree of accuracy in manufacturing a Lamb wave resonator.

Patent Document 1 below, for example, describes a Lamb wave high frequency device that includes IDT electrodes formed on one surface of the piezoelectric substrate, and an adjustment film formed on the other surface of the piezoelectric substrate. The adjustment film is provided to adjust the resonance frequency. Patent Document 2 below describes a technique of selecting crystal orientations of a piezoelectric thin film so as to sufficiently slow down the etch rate, to hydrogen fluoride, of a surface of the piezoelectric thin film on the side facing a supporting member, thereby suppressing a change in thickness as a result of the piezoelectric thin film being dissolved.

RELATED ART DOCUMENT

Patent Document

Patent Document 1: Japanese Patent Application Laid-Open Publication No. 2008-98974
Patent Document 2: Japanese Patent Application Laid-Open Publication No. 2010-220204

SUMMARY OF THE INVENTION

However, the configuration described in Patent Document 1 has a problem of requiring a thickness control for not only the piezoelectric substrate, but also the adjustment film. The technique described in Patent Document 2 lowers a degree of freedom in selecting the material, and possibly puts a limitation on the piezoelectric characteristics.

In view of the above-described situation, the present invention is aiming at providing a Lamb wave device that allows the thickness of a piezoelectric layer to be measured with a high degree of accuracy and that can achieve desired resonance characteristics with ease, and a method of manufacturing the same.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provide a Lamb wave device that includes:

a piezoelectric function member that includes: a piezoelectric substrate having a first surface and a second surface opposite to the first surface; IDT electrodes disposed on the first surface; and a cutout portion that is formed in the piezoelectric substrate, the cutout portion having a step surface provided between the first surface and the second surface; and a supporting member that includes: a supporting surface that is bonded to the second surface, the supporting surface being exposed in the cutout portion toward a side of the first surface; and a cavity formed adjacent to the supporting surface, the cavity facing the IDT electrodes through the piezoelectric substrate.

In another aspect, the present invention provides a method of manufacturing a Lamb wave device, the method including:

forming a cutout portion in a piezoelectric substrate that is formed on a supporting member at a prescribed thickness;

conducting measurement of a thickness of the piezoelectric substrate through the cutout portion; and forming IDT electrodes on a surface of the piezoelectric substrate so as to have an electrode pitch that is set in accordance with the thickness of the piezoelectric substrate.

DETAILED DESCRIPTION OF THE PREFERRED EMBODIMENTS

Figure 1:
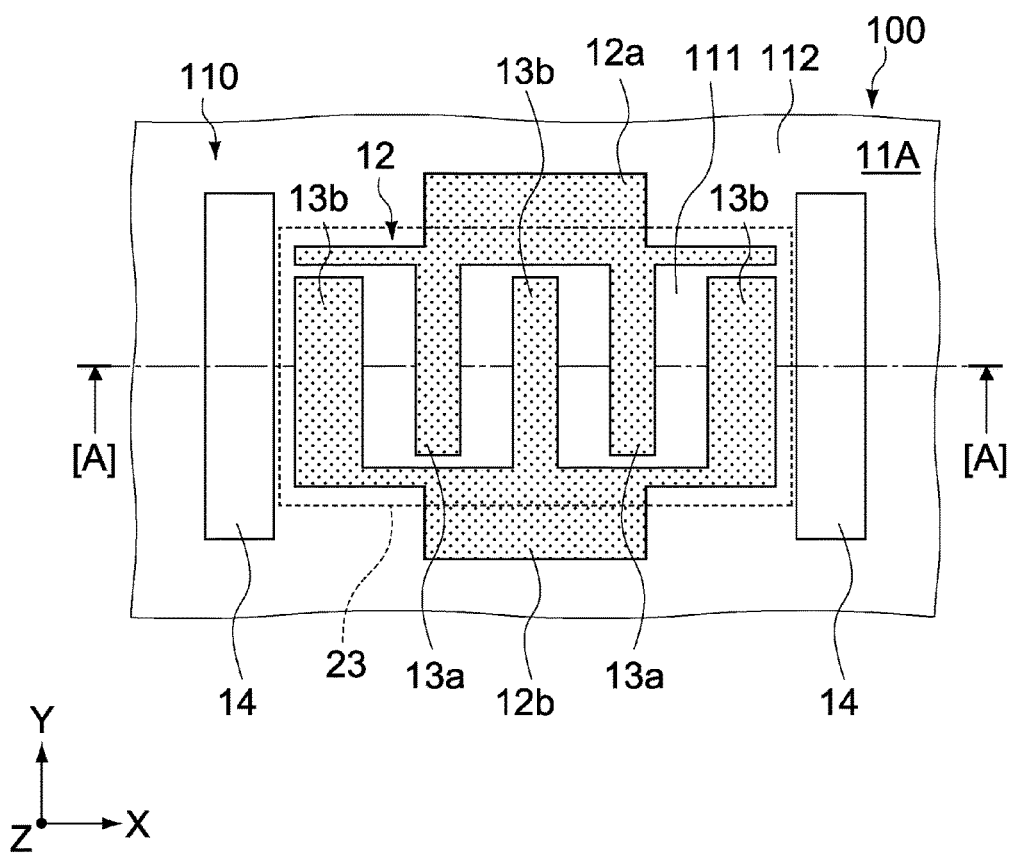
FIG. 1 is a schematic plan view showing a configuration of a Lamb wave device according to Embodiment 1 of the present invention.

A Lamb wave device according to one embodiment of the present invention includes a piezoelectric function member and a supporting member.

The piezoelectric function member has a piezoelectric substrate, IDT electrodes, and a cutout portion. The piezoelectric substrate has a first surface and a second surface opposite to the first surface. The IDT electrodes are disposed on the first surface. The cutout portion is formed in the piezoelectric substrate, and includes a step surface that is provided between the first surface and the second surface.

The supporting member has a supporting surface and a cavity. The supporting surface is bonded to the second surface, and is exposed from the cutout portion toward a side of the first surface. The cavity is formed adjacent to the supporting surface, and faces the IDT electrodes through the piezoelectric substrate.

In the above-mentioned Lamb wave device, the cutout portion that includes a step surface provided between the first surface and the second surface is formed in the piezoelectric substrate. Because this step surface makes it possible to measure the thickness of the piezoelectric substrate with a high degree of accuracy, it is possible to reliably manufacture a Lamb wave device that has desired resonance characteristics.

There is no special limitation on the method of measuring the thickness of the piezoelectric substrate. Typically, the thickness of the piezoelectric substrate is measured by using a stylus surface profiler. When optical characteristics at the bonding surface between the piezoelectric substrate and the supporting member satisfy prescribed conditions, the thickness can also be measured by image processing with a camera, an optical surface profiler, or the like.

The IDT electrodes are formed on the first surface of the piezoelectric substrate typically after the thickness of the piezoelectric substrate is measured through the cutout portion. The electrode pitch of the IDT electrodes is set based on the thickness information of the piezoelectric substrate. In Lamb waves, a relationship of the resonance frequency (Fr) with the propagation velocity (V) and the wavelength ($\lambda$) can be represented as $Fr=V/\lambda$. The propagation velocity (V) of Lamb waves becomes greater as the thickness of the piezoelectric substrate is made thinner. Because the above-mentioned Lamb wave device makes it possible to measure the thickness of the piezoelectric substrate with a high degree of accuracy, by adjusting the electrode pitch of the IDT electrodes in accordance with the thickness of the piezoelectric substrate, a desired resonance frequency can be obtained with ease.

The first surface of the piezoelectric substrate may have a first region that faces the cavity and a second region that surrounds the first region. In this case, the IDT electrodes are disposed in the first region, and the cutout portion is formed in the second region. This makes it possible to prevent the cutout portion from adversely affecting the propagation characteristics of Lamb wave.

There is no special limitation on the structure of the cutout portion. The cutout portion may be a penetrating hole that penetrates the piezoelectric substrate, or may be a groove or step formed inside or around the piezoelectric substrate. The opening of the penetrating hole may be formed in a circular shape, a rectangular shape, or other geometric shapes. The width (diameter) of the opening is not limited to a specific value, and can be appropriately set in accordance with the method of measuring the substrate thickness. For example, when the thickness of the piezoelectric substrate is measured by a stylus surface profiler, the opening width can be set to 30 μm or larger, although depending on the size of the stylus.

The cutout portion may be formed in a plurality of locations in the piezoelectric substrate. This way, it becomes possible to reliably form the IDT electrodes with an electrode pitch that can achieve a desired resonance frequency, even when the thickness of the piezoelectric substrate is not uniform.

The Lamb wave device may further include an external connecting terminal. The external connecting terminal is disposed in the cutout portion, and is electrically connected to the IDT electrodes. In this case, the external connecting terminal is supported by the supporting surface of the supporting member, instead of the piezoelectric substrate. As a result, an external stress that could act on the piezoelectric substrate in a process of forming the external connecting terminal or in a process of mounting the device onto an external circuit board can be decreased, thereby making it possible to prevent the piezoelectric substrate from being damaged.

The piezoelectric function member may further include a filler layer. The filler layer is formed to fill the cutout portion, and is made of a material that has a smaller thermal expansion coefficient than that of the piezoelectric substrate. This makes it possible to suppress expansion or contraction of the piezoelectric substrate as a result of temperature change, and therefore, the effect of temperature to the resonance frequency is decreased.

A method of manufacturing a Lamb wave device according to one embodiment of the present invention includes forming a cutout portion in a piezoelectric substrate formed on a supporting member in a prescribed thickness.

The thickness of the piezoelectric substrate is measured through the cutout portion.

IDT electrodes are formed on a surface of the piezoelectric substrate so as to have an electrode pitch that is set in accordance with the thickness of the piezoelectric substrate.

With this method of manufacturing a Lamb wave device, because the electrode pitch of the IDT electrodes is set in accordance with the thickness of the piezoelectric substrate that was measured through the cutout portion, a Lamb wave device that has a desired resonance frequency can be reliably manufactured.

Below, embodiments of the present invention will be explained with reference to figures.

Embodiment 1

Figure 2:
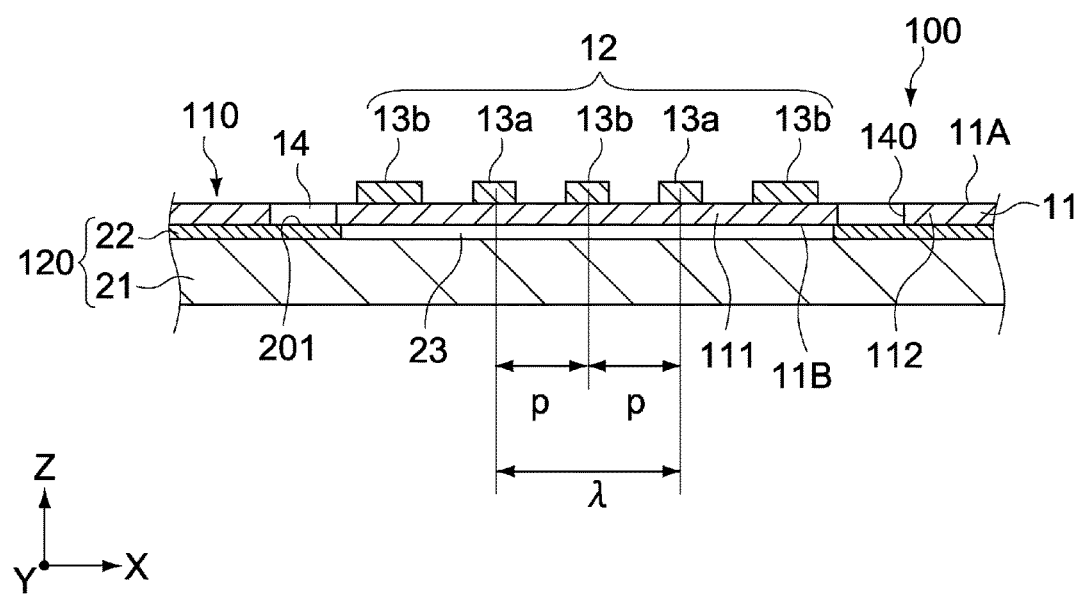
FIG. 2 is a cross-sectional view along the line A-A in FIG. 1.

FIGS. 1 and 2 are schematic diagrams showing a configuration of a Lamb wave device according to Embodiment 1 of the present invention. FIG. 1 is a plan view, and FIG. 2 is a cross-sectional view along the line A-A in FIG. 1. In each figure, respective axis directions of X, Y, and Z represent three axis directions that are orthogonal to each other, and the Z axis direction corresponds to the thickness direction (height direction) of the Lamb wave device.

(Overall Configuration)

A Lamb wave device 100 of this embodiment has a piezoelectric function member 110 and a supporting member 120. The Lamb wave device 100 in this embodiment is configured as a Lamb wave resonator that is used in a transmitting/receiving filter of portable devices.

The piezoelectric function member 110 has a piezoelectric substrate 11 and IDT electrodes 12. The supporting member 120 has a supporting substrate 21 and a bonding layer 22. The supporting member 120 supports the piezoelectric substrate 11 so as to allow it to be excited by the IDT electrodes 12. Below, the respective elements will be explained in detail.

(Piezoelectric Substrate)

The piezoelectric substrate 11 is made of a piezoelectric material, and in this embodiment, a piezoelectric single crystal material such as lithium tantalate (LT) or lithium niobate (LN) is used. Other examples of the piezoelectric material include aluminum nitride (AlN), zinc oxide (ZnO), and lead zirconate titanate (PZT). The thickness of the piezoelectric substrate 11 is not limited, and is set to about 1 µm in this embodiment.

The piezoelectric substrate 11 is typically obtained by forming a substrate at a prescribed thickness, and thereafter thinning the substrate by polishing or the like. Alternatively, the piezoelectric substrate 11 may be formed of a piezoelectric thin film deposited by sputtering or the like.

(IDT Electrodes)

The IDT electrodes 12 are disposed on a upper surface 11A (first surface) of the piezoelectric substrate 11, and includes a pair of comb-shaped electrodes 12a, 12b. The comb-shaped electrodes 12a, 12b respectively have a plurality of electrode fingers 13a, 13b, and are disposed such that the electrode fingers 13a and the electrode fingers 13b are alternately arranged at prescribed intervals. Spacing between the electrode fingers 13a and 13b (electrode pitch p) is determined by the thickness of the piezoelectric substrate 11, the propagation speed of excited Lamb waves, the resonance frequency of the piezoelectric function member 110, and the like. The number of the electrode fingers 13a, 13b is not limited to the example shown in the figure, and the respective electrodes may have a greater number of electrode fingers.

The electrode pitch is typically set to a half of the wavelength of Lamb waves to be excited (λ/2). The resonance frequency Fr[Hz] of the Lamb wave device 100 (piezoelectric function member 110) satisfies the following relationship, where the wavelength and the propagation speed (phase velocity) of Lamb waves are respectively defined as λ[m] and V[m/s]:

$$Fr = V/\lambda \qquad (1).$$

Figure 3:
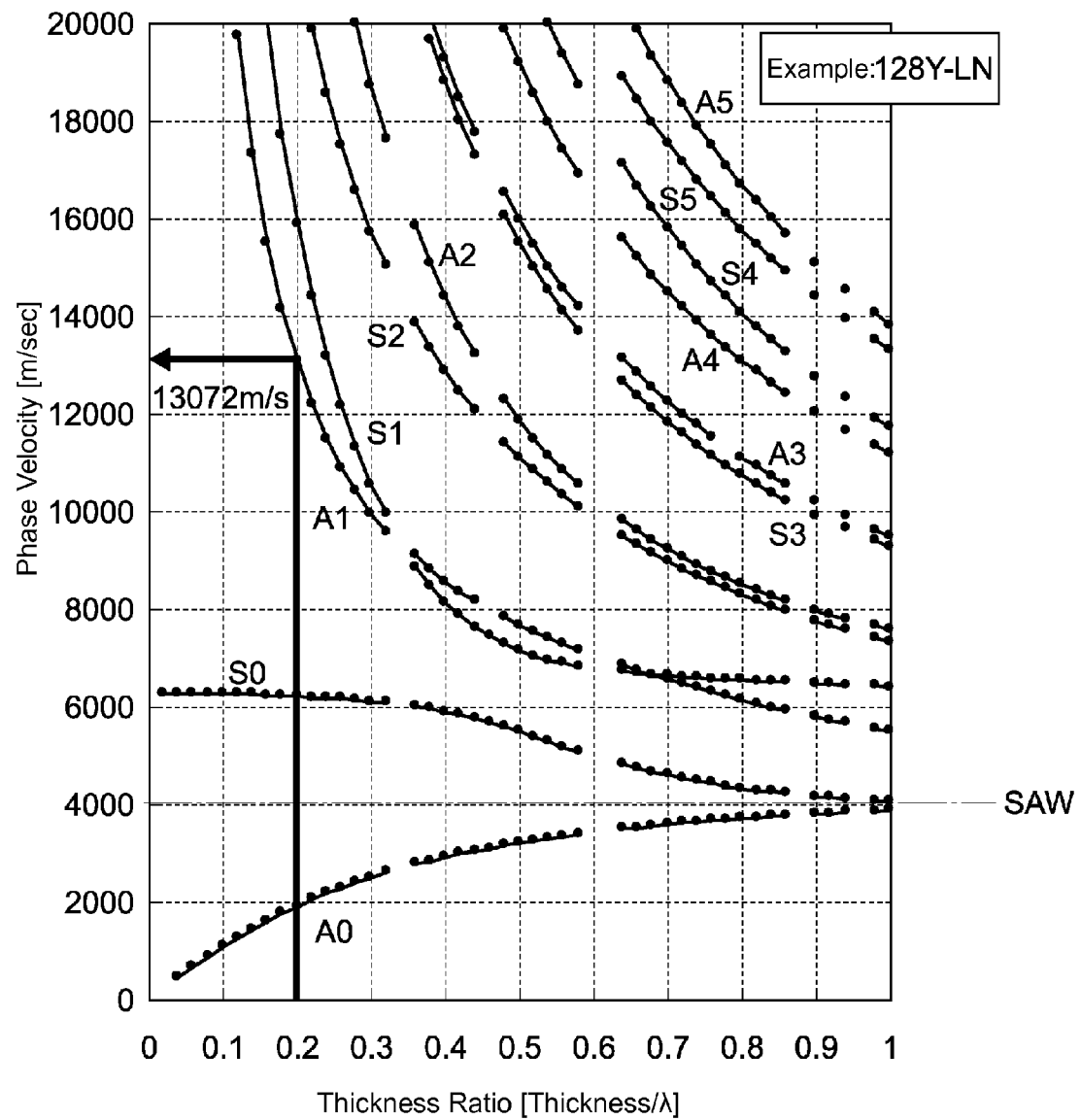
FIG. 3 is a diagram showing the phase velocity characteristics of a 128Y-LN substrate.

The propagation speed of Lamb waves becomes faster as the thickness of the piezoelectric substrate is made thinner. This tendency is more pronounced at a higher-order mode. The propagation speed of Lamb waves is generally represented as a relationship with the thickness ratio (thickness/wavelength) that is a ratio of the thickness of the piezoelectric substrate to the wavelength. As an example, FIG. 3 shows the phase velocity characteristics of a 128Y (128° revolution Y-cut)-LN substrate. In this example, the phase velocity of Lamb waves (A1 mode) when the thickness ratio is 0.2 is 13072 m/s.

Of the pair of comb-shaped electrodes 12a, 12b that constitute the IDT electrodes 12, one comb-shaped electrode is connected to input/output terminals, for example, and the other comb-shaped electrode is connected to a ground terminal, for example. Although not shown in the figure, the piezoelectric function member 110 may have reflectors that reflect Lamb waves excited by the IDT electrodes 12. In this case, the reflectors are arranged at both sides of the IDT electrodes 12 so as to sandwich the IDT electrodes 12.

(Supporting Member)

The supporting member 120 includes a supporting substrate 21 that supports the piezoelectric function member 110, and a bonding layer 22 that bonds the piezoelectric function member 110 to the supporting substrate 21.

The supporting substrate 21 is formed of a material that has an appropriate strength or rigidity to support the piezoelectric function member 110. As such a material, silicon is typically used, but it is also possible to use various materials such as metal, glass, sapphire, and plastic. The thickness of the supporting substrate 21 is about 300 µm, for example.

As the bonding layer 22, an adhesive is typically used, but it is also possible to use various materials such as a filler metal and an adhesive tape. As the adhesive, an UV-curable resin, a thermosetting resin, a thermoplastic resin, a pressure-sensitive adhesive, or the like can be used.

The bonding layer 22 forms a supporting surface 201 of the supporting member 120, and is bonded to a lower surface 11B (second surface) of the piezoelectric substrate 11, which is the opposite surface of the upper surface 11A. The bonding layer 22 is formed in a rectangular frame shape. This way, a cavity 23 that is surrounded by the lower surface 11B of the piezoelectric substrate 11, the upper surface of the supporting substrate 21, and the inner surface of the bonding layer 22 is formed.

The cavity 23 is formed adjacent to the supporting surface 201, and faces the IDT electrodes 12 through the piezoelectric substrate 11. That is, the cavity 23 forms a free space that allows the piezoelectric substrate 11 to vibrate at a prescribed resonance frequency. When a region of the piezoelectric substrate 11 that faces the cavity 23 is a first region 111, the electrode fingers 13a, 13b of the IDT electrodes 12 are respectively disposed in this first region 111 on the upper surface 11A side. On the other hand, a frame-shaped region that surrounds the first region 111 is defined as a second region 112 of the piezoelectric substrate 11, and this second region 112 corresponds to a region that is supported by the supporting member 120 (bonding layer 22).

The height of the cavity 23 is set to an appropriate value by adjusting the thickness of the bonding layer 22, and is set to 1 µm, for example. In addition, it is possible to form a recess of an appropriate depth in the surface region of the supporting substrate 21 that is surrounded by the bonding layer 22. This way, the height of the cavity 23 can be adjusted appropriately.

The bonding layer 22 may be omitted where appropriate. That is, the supporting substrate 21 may be directly bonded to the piezoelectric substrate 11. In this case, the supporting substrate 21 constitutes the supporting member 120, and the upper surface of the supporting substrate 21 that is bonded to the piezoelectric substrate 11 forms the supporting surface 201 of the supporting member 120. Also, in this case, the cavity 23 is formed by a recess, an opening, or a hole that is formed at the upper surface of the supporting substrate 21.

(Cutout Portion)

The resonance frequency (Fr) of the Lamb wave device is determined by the propagation velocity (V) and the wavelength (λ) of the Lamb waves as shown in Formula (1). The wavelength (λ) is determined by the electrode pitch (FIG. 2) of the electrode fingers 13a, 13b of the IDT electrodes 12. That is, the resonance frequency of the Lamb wave resonator depends on the thickness of the piezoelectric substrate 11 and the electrode pitch of the IDT electrodes respectively.

However, it is not easy to control the thickness of the piezoelectric substrate with a high degree of accuracy, and in order to obtain a piezoelectric substrate having a desired thickness, an increase in manufacturing cost and degradation of productivity would be necessary. Also, if the thickness of the piezoelectric substrate is not uniform along the surface, the propagation velocity (V) varies, which would make it difficult to obtain a desired resonance frequency.

In view of the above problems, in this embodiment, the thickness of a piezoelectric substrate is obtained through actual measurement, and in accordance with the measured value, the electrode pitch of the IDT electrodes is adjusted, thereby making it possible to obtain a Lamb wave device that has a desired resonance frequency.

That is, in the Lamb wave device 100 of this embodiment, the piezoelectric function member 110 has cutout portions 14. Each of the cutout portions 14 is formed in the piezoelectric layer 11, and includes a step surface 140 that is provided between the upper surface 11A and the lower surface 11B of the piezoelectric substrate 11.

In this embodiment, the cutout portions 14 are constituted of penetrating holes that are formed in the second region 112 of the piezoelectric substrate 11 and that penetrate the piezoelectric substrate 11. Therefore, portions of the supporting surface 201 of the supporting member 120 are exposed from the cutout portions 14 toward the upper surface side of the piezoelectric substrate 11.

The cutout portions 14 are used to measure the thickness of the piezoelectric substrate 11. The cutout portions 14 are formed in the second region 112 of the piezoelectric substrate 11, and therefore, the bottoms of the cutout portions 14 are the supporting surface 201 of the supporting member 120. This makes it possible to obtain the thickness data of the piezoelectric substrate 11 with a high degree of accuracy by measuring the dimension of the step surfaces 140 in the vertical direction (depth of the cutout portions 14). As a result, based on the thickness of the piezoelectric substrate 11, it is possible to estimate the degree of variations in resonance frequency and to understand the degree of adjustment that is needed. By determining the electrode pitch of the IDT electrodes 12 in accordance with such information, variations in Lamb wave resonators resulting from the manufacturing process can be suppressed.

In this embodiment, by measuring the step surfaces 140 of the cutout portions 14 using a stylus surface profiler, the thickness of the piezoelectric substrate 11 can be measured. Thus, it is possible to measure the thickness of the piezoelectric substrate 11 with a high degree of accuracy without relying on the optical characteristics of the supporting surface 201.

In a case where the depth of the cutout portions is to be measured by an optical interferometric surface profiler, if the surface of the supporting member exposing from the cutout portions is made of a transparent material or a resin, the enough intensity of reflection light could not be measured due to light transmission, absorption, and the like. On the other hand, with a stylus surface profiler, a highly accurate measurement for the size of the step can be achieved regardless of optical characteristics of the supporting member.

The opening of the cutout portions 14 is formed to be a substantially rectangular shape, but the shape of the opening is not limited to this, and may be any other geometric shapes. For example, the opening of the cutout portions 14 may be formed in a shape that includes an arch such as a circle, an oval, or an ellipse, or a symbolic shape such as a star or a cross. The size of the opening of the cutout portions 14 (opening width) is not limited as long as it allows the stylus of the surface profiler to enter the cutout portions 14, and is set to 30 μm or greater, for example.

Figure 4A:
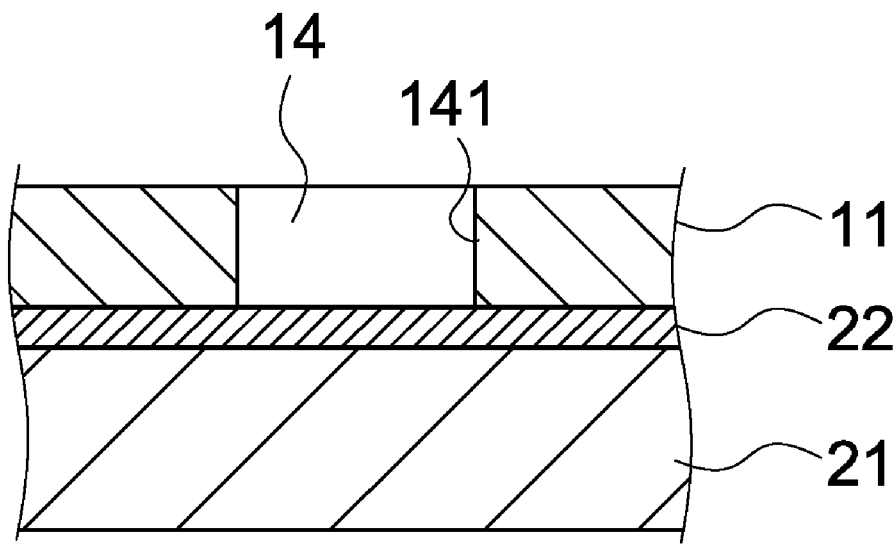
FIGS. 4A and 4B are cross-sectional views showing a principal portion of the Lamb wave device.
Figure 4B:
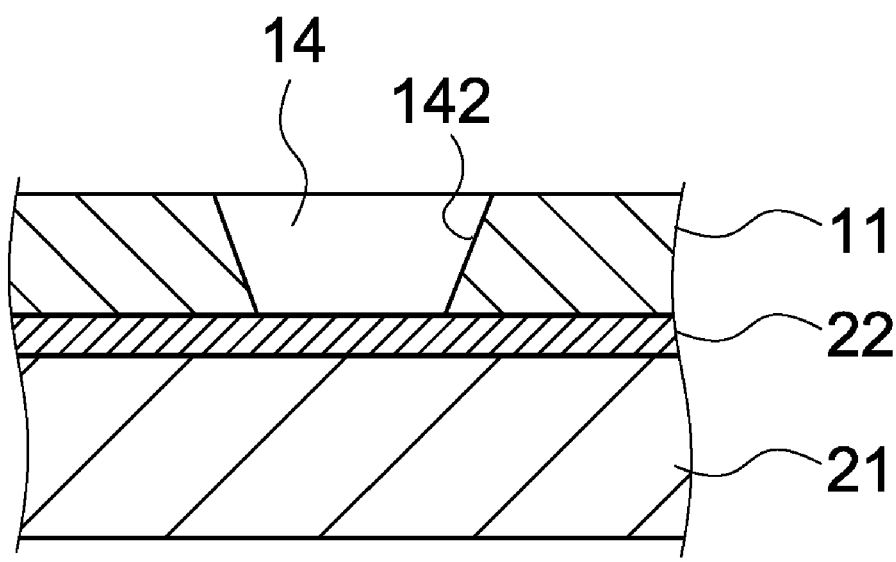

There is no special limitation on the method of forming the cutout portions 14, and various surface processing techniques such as etching, laser processing, or machine processing can be employed. The type of the step surfaces 140 of the cutout portions 14 varies depending on the processing technique; it may be a step surface 141 that is perpendicular to the surface of the piezoelectric substrate 11 as shown in FIG. 4A, or may be a tapered step surface 142 that is inclined at a prescribed angle as shown in FIG. 4B.

Depending on the processing technique, the tapered step surface 142 is more preferable than the vertical step surface 141. For example, when forming an opening with a vertical step surface by conducting dry-etching on an LT substrate or an LN substrate, etching reactants may be re-deposited at the edge of the opening. In this case, the reactants deposited at the edge make it difficult to accurately measure the depth of the opening. On the other hand, if the opening is formed in the substrate so as to have a tapered step surface, the etching reactants are less likely to be deposited at the edge of the opening, thereby making it possible to improve the measurement accuracy of the depth of the step.

The surface characteristics of the step surfaces of the cutout portions 14 also vary depending on the processing technique. For example, when the cutout portions 14 are formed with a dicer, the resultant surface is rough, and chipping at the edge of the opening is more likely to occur. In this case, it is difficult to conduct an accurate measurement. On the other hand, with a dry-etching process, the resultant surface can be made relatively smooth, and chipping at the edge of the opening is less likely to occur. This allows for an accurate measurement, and the thickness of the piezoelectric substrate 11 can be measured with a high degree of accuracy.

There is no special limitation on positions of the cutout portions 14. However, when the cutout portions 14 are disposed near the IDT electrodes 12, the thickness of the piezoelectric substrate 11 in the region where the IDT electrodes 12 are arranged can be measured with a high degree of accuracy. Also, by forming the cutout portions 14 in the second region 112, it is possible to prevent the cutout portions 14 from affecting the propagation characteristics of Lamb waves that propagate in the first region 111 of the Lamb wave device 100.

The Lamb wave device 100 of this embodiment has a plurality of cutout portions 14. As shown in FIGS. 1 and 2, the plurality of cutout portions 14 are disposed in the second region 112 at both sides of the IDT electrodes 12. This makes it possible to measure the thickness of the piezoelectric substrate 11 with a higher degree of accuracy, and to adjust the electrode pitch of the IDT electrodes taking into account the variations in thickness.

The plurality of cutout portions 14 may be formed in the same shape as each other, or may be formed in different shapes. There is no special limitation on the size thereof; the size of the cutout portions 14 can be appropriately set in accordance with the shape, location, and the like of each cutout portion 14.

As described, in the Lamb wave device 100 of this embodiment, the cutout portions 14 that respectively include the step surfaces 140 (141, 142), which are provided between the upper surface 11A and the lower surface 11B of the piezoelectric substrate 11, are formed in the piezoelectric substrate 11. This makes it possible to accurately measure the thickness of the piezoelectric substrate 11 through the step surfaces. Therefore, it is possible to reliably manufacture a Lamb wave device that has desired resonance characteristics.

(Manufacturing Method)

Next, a method of manufacturing the Lamb wave device 100 configured in the manner described above will be explained. In this embodiment, in manufacturing the Lamb wave device 100, a plurality of devices are fabricated at the same time at wafer level, and are thereafter cut into individual chips.

FIGS. 5A to 5F are schematic process cross-sectional views of one device, which illustrate the method of manufacturing the Lamb wave device 100 of this embodiment.

Figure 5A:
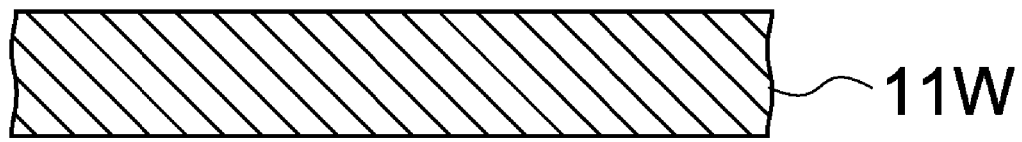
FIGS. 5A to 5F are process cross-sectional views illustrating a method of manufacturing the Lamb wave device.

First, as shown in FIG. 5A, a relatively thick wafer is prepared as a piezoelectric substrate 11W. As the piezoelectric substrate 11W, an LT substrate or an LN substrate is used, for example. There is no special limitation on the thickness of the piezoelectric substrate 11W. The thickness is appropriately set so as to allow for easy handling. The thickness of the piezoelectric substrate 11W can be set to 300 um, for example.

Figure 5B:
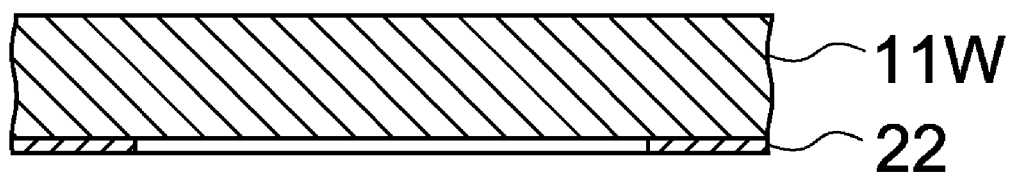

Next, as shown in FIG. 5B, a frame-shaped bonding layer 22 is formed on the lower surface of the piezoelectric substrate 11W. As the bonding layer 22, a resin adhesive material is used, for example. The bonding layer 22 is formed at a thickness that is required to form the cavity 23 (1 μm, for example).

Figure 5C:
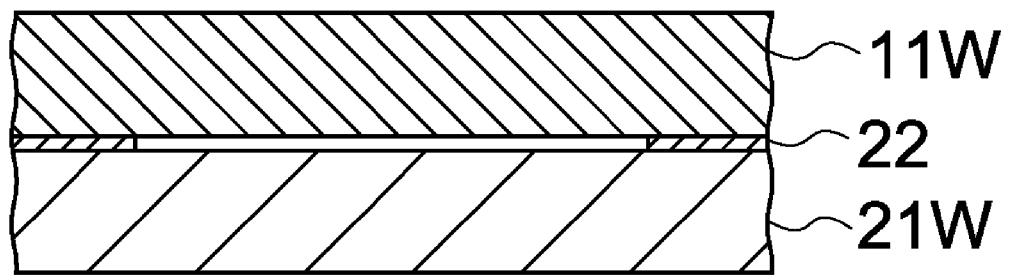

Next, as shown in FIG. 5C, the piezoelectric layer 11W is disposed on the upper surface of a wafer, which is a supporting substrate 21W, such that the bonding layer 22 is interposed therebetween. As the supporting substrate 21W, a silicon substrate having a thickness of 300 μm is used, for example.

Figure 5D:
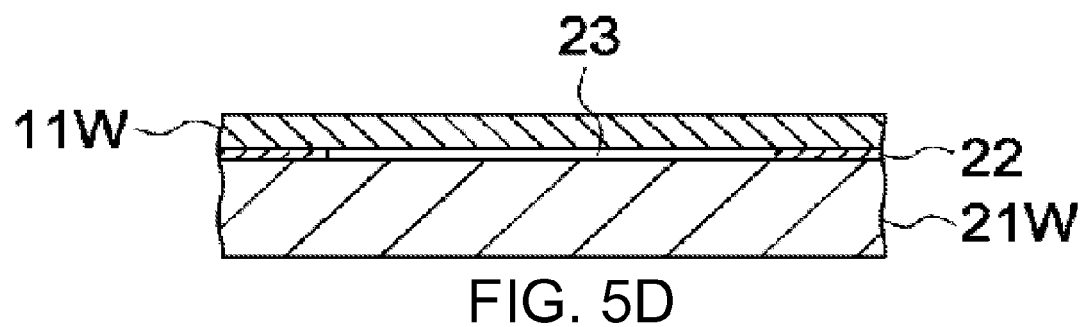

Next, as shown in FIG. 5D, the piezoelectric substrate 11W is thinned to a prescribed thickness (1 μm, for example). This way, the piezoelectric substrate 11W having a membrane structure is fabricated. Typically, the piezoelectric substrate 11W is thinned by CMP (chemical mechanical polishing).

Figure 5E:
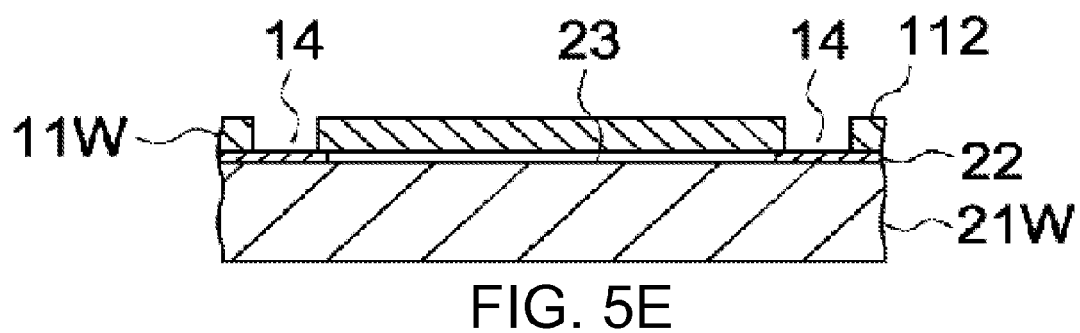

Next, as shown in FIG. 5E, in a region on the piezoelectric substrate 11W supported by the bonding layer 22 (second region 112), cutout portions 14 are formed so as to penetrate the piezoelectric substrate 11W.

In this embodiment, the cutout portions 14 are formed by dry-etching. As the etching equipment, a plasma etching equipment (NLD made by ULVAC, Inc.) is used, and as the etching gas, a mixed gas of $C_3F_8$ and Ar is used. There is no special limitation on the etching conditions, and for example, the RF power is set to 600 W (13.56 MHz), the substrate bias is set to 300 W, the processing pressure is set to 0.66 Pa, and the etching gas flows are set to 80 sccm for Ar and 20 sccm for $C_3F_8$, respectively.

In forming the cutout portions 14, a prescribed photoresist pattern is formed on the piezoelectric substrate 11W in advance, and the piezoelectric substrate 11W is etched by using this photoresist pattern as a mask. The cutout portions 14 are formed so as to have tapered step surfaces 142 (see FIG. 4B), thereby preventing the etching reactants from being deposited at the opening edge of the cutout portions 14. Such step surfaces 142 can be obtained by using a photoresist mask that is formed such that the size of the photoresist opening gradually increases as the etching process progresses, for example.

Next, using the cutout portions 14, the thickness of the piezoelectric substrate 11W is measured.

The cutout portions 14 penetrate the piezoelectric substrate 11W, and the bottoms of the cutout portions 14 are formed by the bonding layer 22. This means that the size of the cutout portions 14 (depth of the cutout portions 14) corresponds to the thickness of the piezoelectric substrate 11W. Therefore, by measuring the depth of the cutout portions 14, the thickness of the piezoelectric substrate 11W at the positions where the cutout portions 14 are formed can be measured.

Figure 5F:
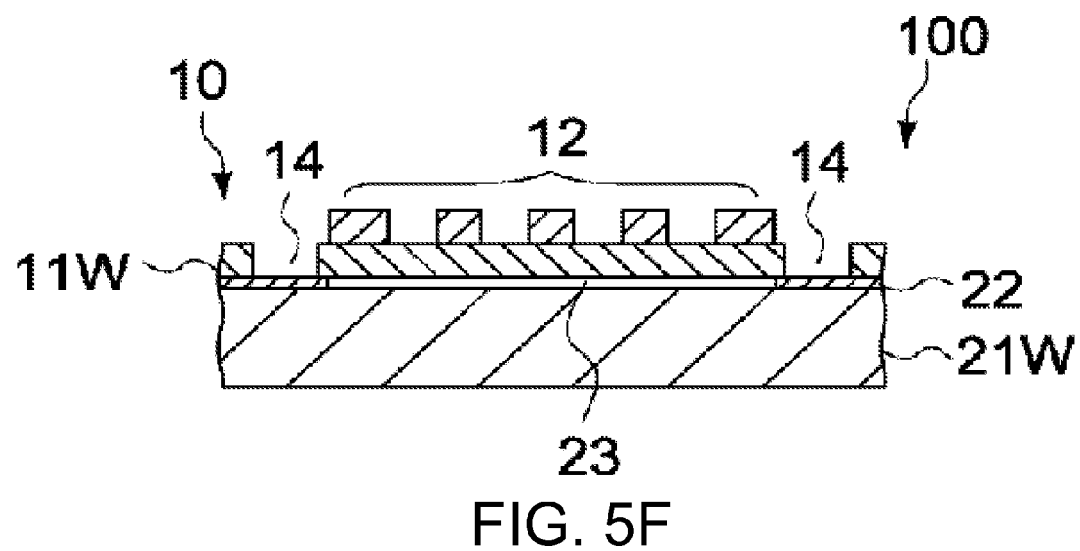

Next, as shown in FIG. 5F, IDT electrodes 12 that have an electrode spacing (electrode pitch) determined in accordance with the measured thickness of the piezoelectric substrate 11W is formed at a prescribed position (first region 111) on the piezoelectric substrate 11W. This way, the Lamb wave device 100 that has a desired resonance frequency can be manufactured.

Specifically, the wavelength (λ) of Lamb waves that can achieve desired resonance characteristics is derived from the measured thickness of the piezoelectric substrate 11W. Because spacing between the electrode fingers 13a, 13b of the IDT electrodes 12 (electrode pitch) corresponds to a half of the wavelength (λ/2), the electrode pitch can be determined based on the derived wavelength (λ).

Further, by using a plurality of cutout portions 14 disposed at a plurality of places in the piezoelectric substrate 11W, it is possible to obtain the distribution of the thickness of the piezoelectric substrate 11W in the in-plane direction. This makes it possible to form a plurality of pairs of IDT electrodes 12 that have different electrode pitches, respectively, in a plurality of regions.

As a result, when fabricating devices at wafer level, an optimum electrode pitch can be set for each device region. In a Lamb wave device in which a plurality of pairs of IDT electrodes are provided in a single device region, an optimum electrode pitch can be set for each of the regions where the respective pairs of IDT electrodes are disposed based on the thickness of the piezoelectric substrate measured in each of such regions.

As described above, the piezoelectric substrate is thinned to a prescribed thickness (1 μm, for example) by a polishing or a grinding process, but variations in the thinning process can cause variations in the thickness of the substrate in the in-plane direction. In a case of a 128Y-LN substrate, for example, the thickness thereof may be 1.0 μm in the center and 0.8 μm in the circumference. When the resonance frequency is set to 3.5 GHz, by setting the wavelength to 2.95 μm at the center of the substrate and to 3.95 μm at the circumference of the substrate, the propagation speed of Lamb waves in A1 mode becomes 10320 m/s at the center of the substrate and 13825 m/s at the circumference of the substrate as shown in FIG. 3. As described, desired filter characteristics can be attained within a single substrate (wafer).

There is no special limitation on the method of fabricating the IDT electrodes 12. For example, the IDT electrodes 12 can be formed by forming a photoresist pattern on an electrode layer deposited on a surface of the piezoelectric substrate, and by patterning the layer through etching using the photoresist pattern as a mask. Alternatively, the IDT electrodes 12 can be formed by depositing an electrode layer over a photoresist mask formed on a surface of the piezoelectric substrate, and by thereafter removing the photoresist mask (lift-off).

The IDT electrodes 12 are formed by a metal material such as Al, an Al—Cu alloy, Cu, Ru, Pt, Au, Ta, Ti, or Cr, for example. The thickness of the IDT electrodes 12 is not limited, and is set to 0.2 µm, for example. The metal film forming the IDT electrodes 12 can be formed by various methods such as sputtering, vacuum deposition, or ion-plating, for example. In this case, the material to form the IDT electrodes 12 may be left in the cutout portions 14, or alternatively, a photoresist mask can be formed to cover the cutout portions 14 in fabricating the IDT electrodes 12.

After the IDT electrodes 12 are formed, necessary processes are conducted. Thereafter, the piezoelectric substrate 11W undergoes a dicing process to be divided into respective device regions (separated into individual chips). The processes conducted after forming the IDT electrodes 12 include a step of forming external connecting terminals and a step of forming a protective film.

In the manner described above, the Lamb wave device 100 is manufactured. With this embodiment, because the electrode pitch of the IDT electrodes 12 is set in accordance with the thickness of the piezoelectric substrate 11 that was measured by using the cutout portions 14, a Lamb wave device that has a desired resonance frequency can be reliably manufactured.

Embodiment 2

Figure 6:
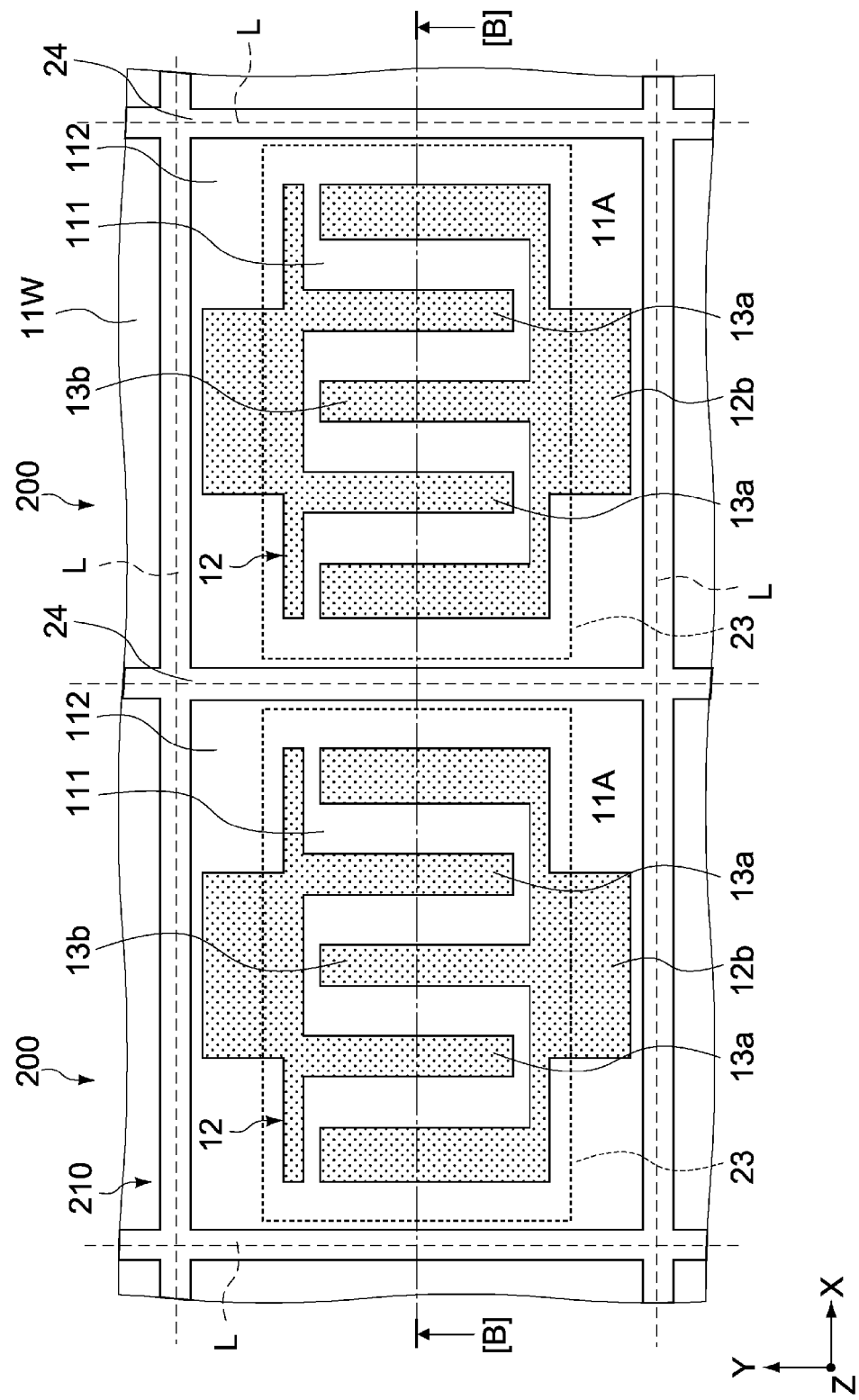
FIG. 6 is a schematic plan view showing a configuration of a Lamb wave device according to Embodiment 2 of the present invention.
Figure 7:
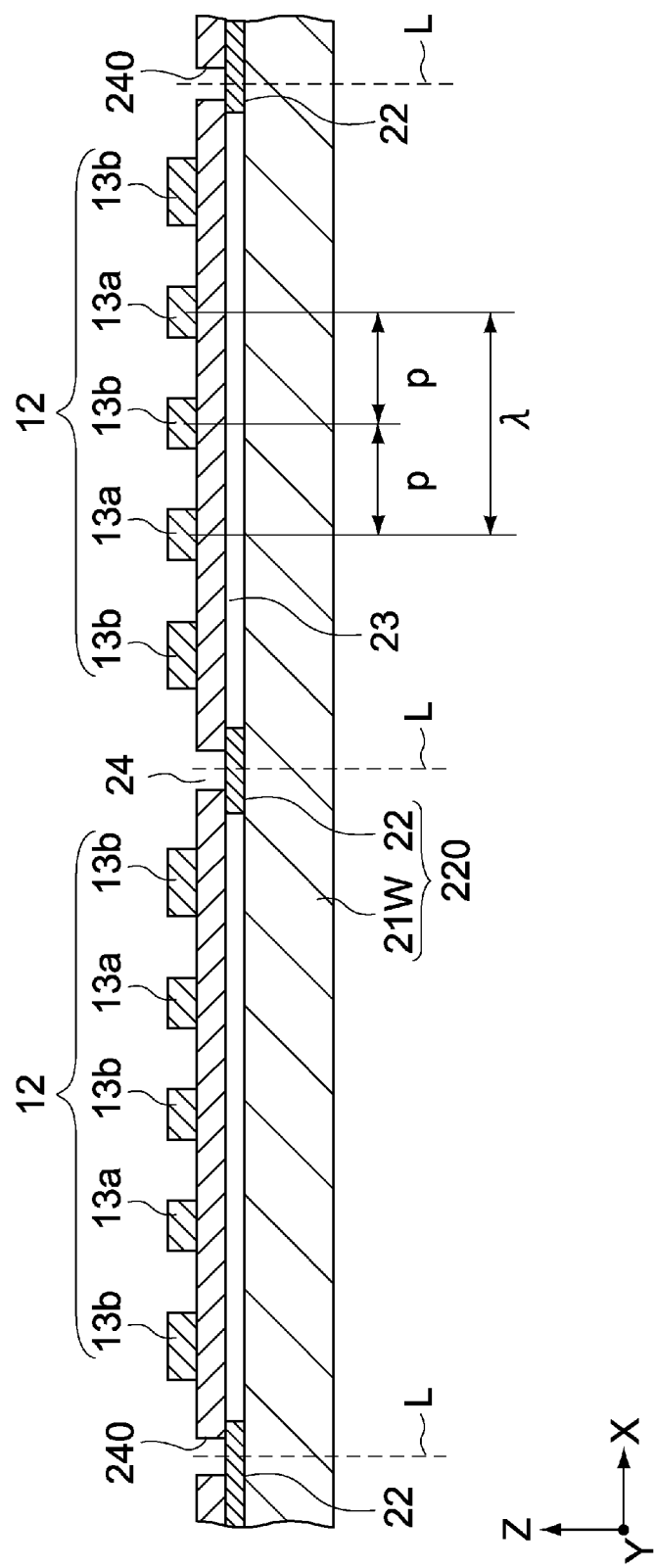
FIG. 7 is a cross-sectional view along the line B-B in FIG. 6.
Figure 8:
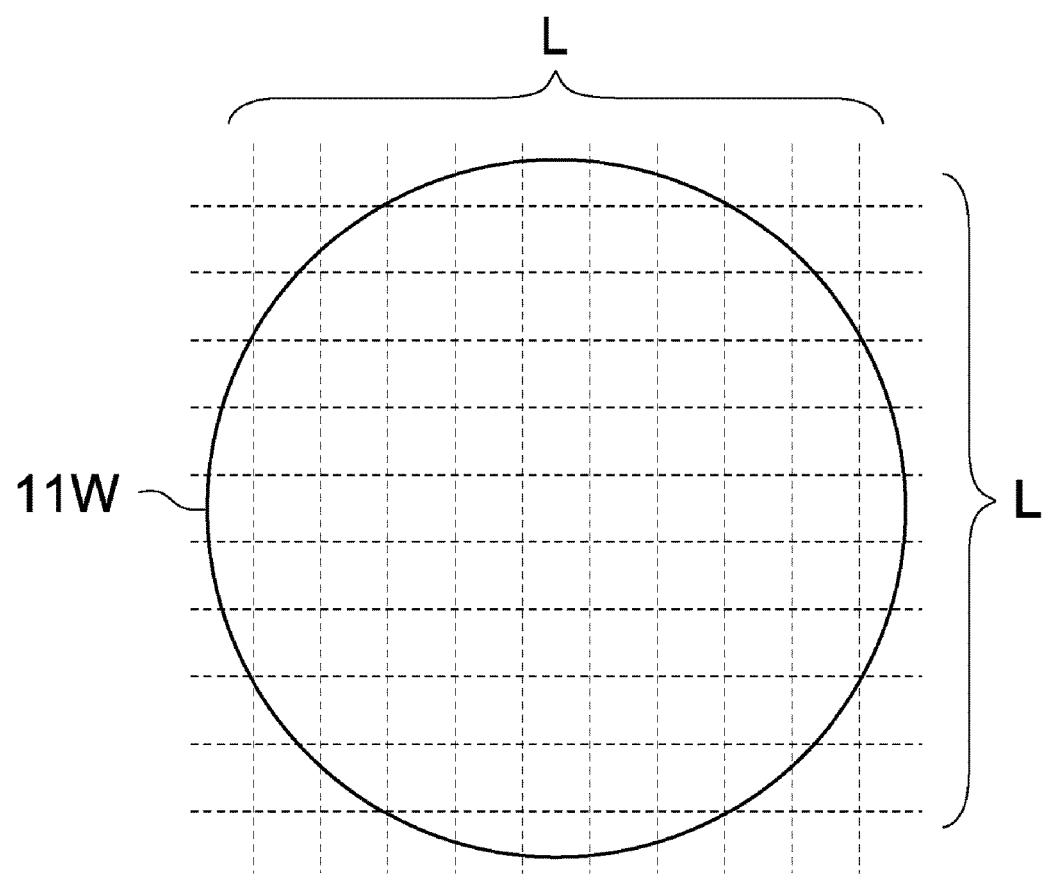
FIG. 8 is a plan view of a piezoelectric substrate schematically showing a dicing line.

FIGS. 6 and 7 are schematic diagrams showing a configuration of a Lamb wave device of Embodiment 1 of the present invention. FIG. 6 is a plan view showing two adjacent device regions at wafer level, and FIG. 7 is a cross-sectional view along the B-B line in FIG. 6. FIG. 8 is a plan view of the piezoelectric substrate as a wafer.

In each figure, respective axis directions of X, Y, and Z represent three axis directions that orthogonal to each other, and the Z axis direction corresponds to the thickness direction (height direction) of the Lamb wave device. Below, differences from Embodiment 1 will be mainly explained. Configurations similar to those of Embodiment 1 are given similar reference characters, and descriptions thereof are omitted or simplified.

A Lamb wave device 200 of this embodiment has a piezoelectric function member 210 and a supporting member 220. The piezoelectric function member 210 has a piezoelectric substrate 11W (11), IDT electrodes 12, and a cutout portion 24.

The cutout portion 24 is used to measure the thickness of the piezoelectric substrate 11W, which makes it possible to calculate an appropriate electrode pitch of the IDT electrodes 12. The cutout portion 24 is a linear groove or recess, and is formed in the second region 112 of the piezoelectric substrate 11W. In this embodiment, the cutout portion 24 is formed along the boundary between a plurality of Lamb wave devices 200 adjacent to each other, and more specifically, is formed along a dicing line L.

The cutout portion 24 includes a step surface 240 provided between the upper surface and the lower surface of the piezoelectric substrate 11. The cutout portion 24 is formed by dry-etching, for example, and the step surface 240 is formed as a tapered surface, for example.

Figure 9A:
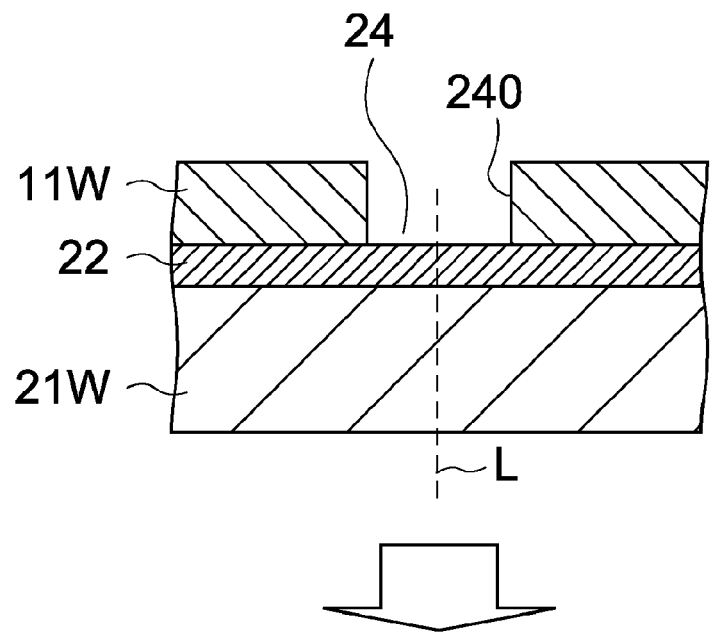
FIGS. 9A and 9B are cross-sectional views of a principal portion of the Lamb wave device before and after dicing.
Figure 9B:
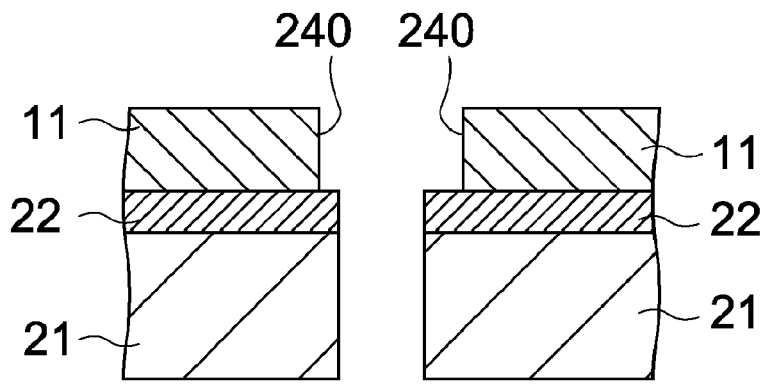

The cutout portion 24 is formed to be wider than the width of a dicing blade (dicing saw). For example, when a 30 µm-wide blade is used for dicing, the width of the cutout portion 24 is set to 50 µm, for example. This makes it possible to prevent the piezoelectric substrate 11W from being damaged upon dicing. FIGS. 9A and 9B are enlarged cross-sectional views of a principal portion of a multi-layer substrate made of the piezoelectric substrate 11W and the supporting substrate 21W before and after dicing.

The cutout portion 24 is formed throughout the upper surface 11A of the piezoelectric substrate 11W so as to serve as the dicing line L, but because the piezoelectric substrate 11W is supported by the supporting member 220, the degradation of the strength thereof does not cause a problem.

In this embodiment, the cutout portion 24 is formed along the dicing line L, and therefore, it is possible to measure the thickness of the piezoelectric substrate 11W at any position around the device region. Thus, a desired electrode pitch of the IDT electrodes 12 can be calculated with a high degree of accuracy through measurement.

With the Lamb wave device 200 of this embodiment configured in the manner described above, effects similar to Embodiment 1 above can be obtained. That is, in this embodiment, the piezoelectric substrate 11W (11) is provided with the cutout portion 24, and by using the step surface 240 thereof, the thickness of the piezoelectric substrate 11W (11) can be measured with a high degree of accuracy. Therefore, it is possible to reliably manufacture a Lamb wave device that has desired resonance characteristics.

Embodiment 3

Figure 10:
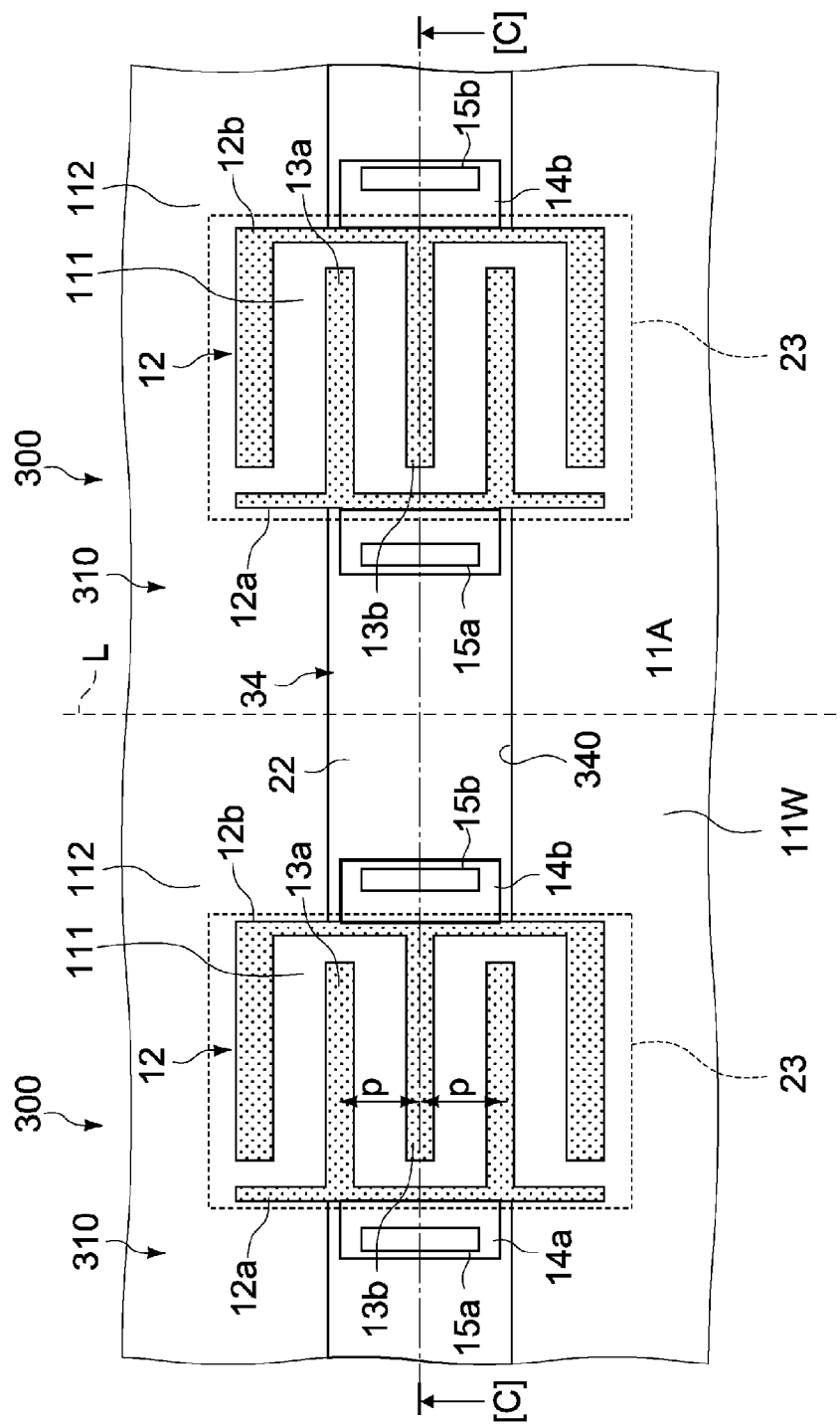
FIG. 10 is a schematic plan view showing a configuration of a Lamb wave device according to Embodiment 3 of the present invention.
Figure 11:
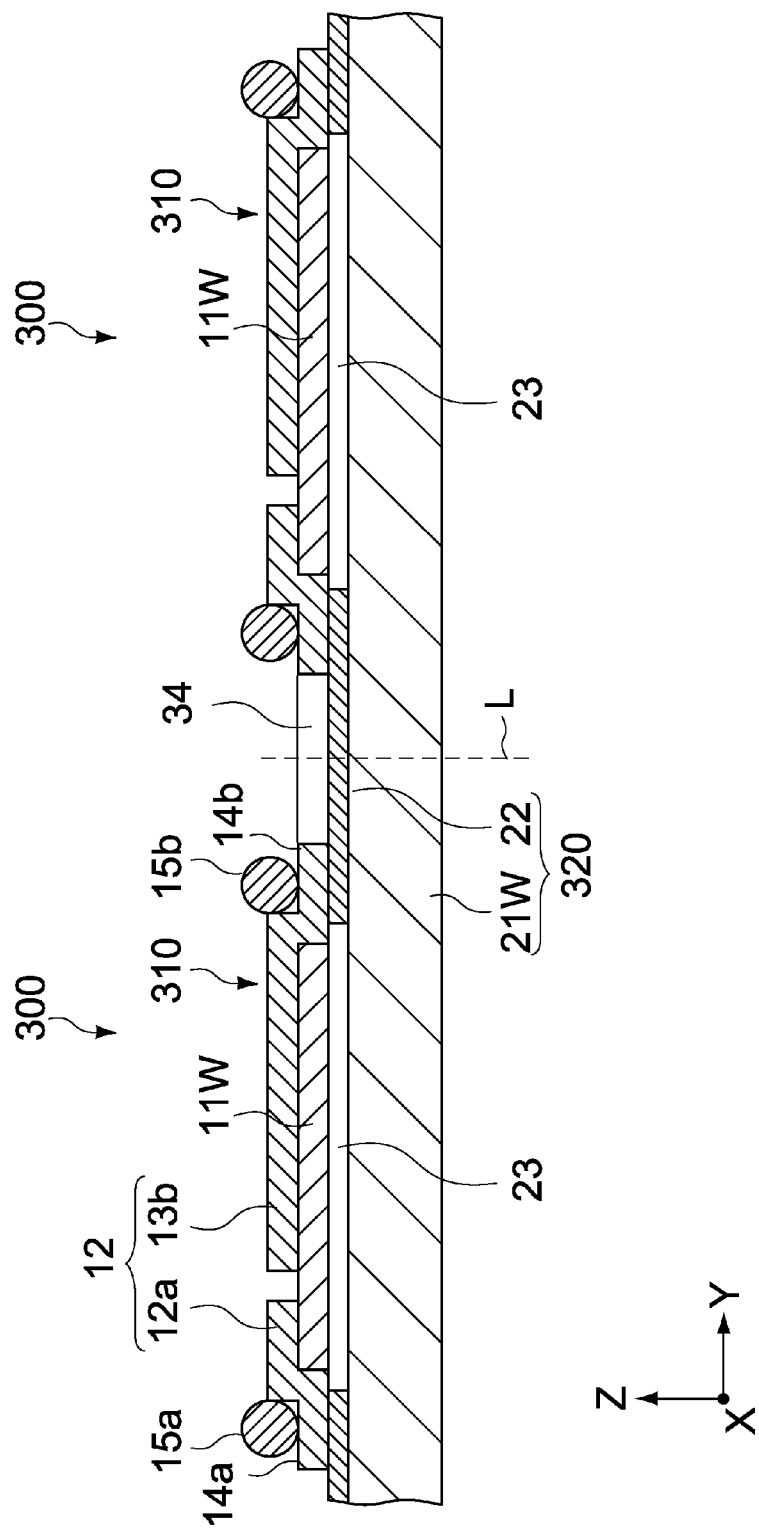
FIG. 11 is a cross-sectional view along the line C-C in FIG. 10.
Figure 12:
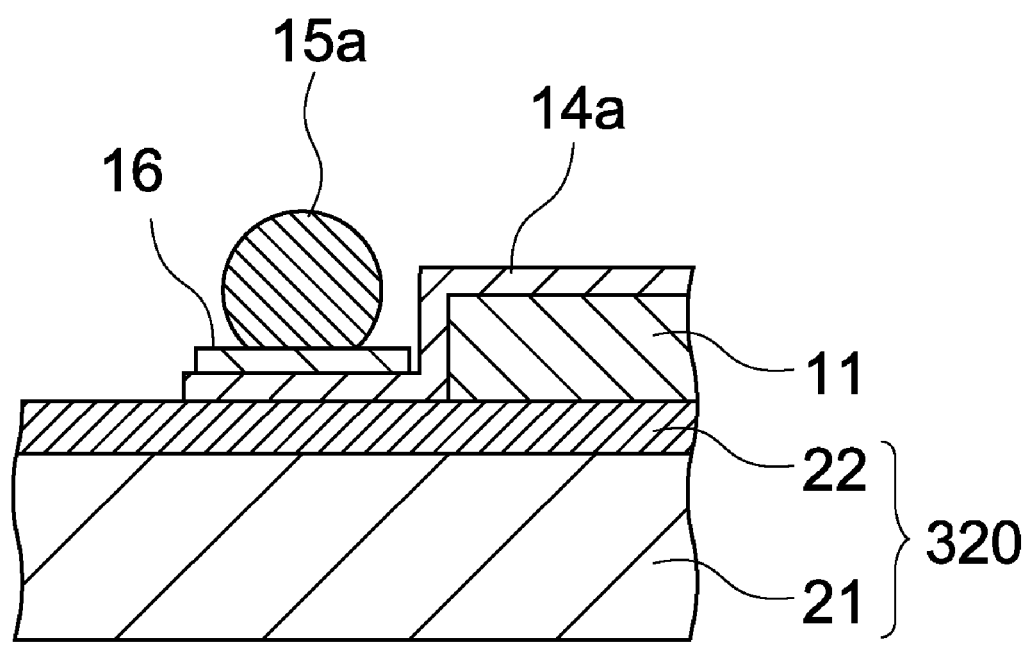
FIG. 12 is an enlarged view of a principal portion of the Lamb wave device.

FIGS. 10 to 12 are schematic diagrams showing a configuration of a Lamb wave device of Embodiment 3 of the present invention. FIG. 10 is a plan view showing two adjacent device regions at wafer level, and FIG. 11 is a cross-sectional view along the line C-C in FIG. 10. FIG. 12 is a cross-sectional view showing a principal portion of the Lamb wave device.

In each figure, respective axis directions of X, Y, and Z represent three axis directions that orthogonal to each other, and the Z axis direction corresponds to the thickness direction (height direction) of the Lamb wave device. Below, differences from Embodiment 1 will be mainly explained. Configurations similar to those of the embodiments above are given similar reference characters, and descriptions thereof are omitted or simplified.

A Lamb wave device 300 of this embodiment has a piezoelectric function member 310 and a supporting member 320. The piezoelectric function member 310 has a piezoelectric substrate 11W (11), IDT electrodes 12, and a cutout portion 34.

In a manner similar to Embodiment 1, the cutout portion 34 is used to measure the thickness of the piezoelectric substrate 11W, which makes it possible to calculate an appropriate electrode pitch of the IDT electrodes 12. The cutout portion 34 is a linear groove or recess, and is formed in the second region 112 of the piezoelectric substrate 11W. In this embodiment, the cutout portion 34 is disposed in a boundary portion between two adjacent Lamb wave devices 300, and is formed in a band shape so as to connect one IDT electrode 12 (comb-shaped electrode 12a) of one Lamb wave device 300 to one IDT electrode 12 (comb-shaped electrode 12b) of the other Lamb wave device 300.

The cutout portion 34 includes a step surface 340 provided between the upper surface and the lower surface of the piezoelectric substrate 11. The cutout portion 34 is formed by dry-etching, for example, and the step surface 340 is formed as a tapered surface, for example.

The external connecting terminals 15a, 15b are respectively disposed on lead-out wiring lines 14a, 14b that connect the upper surfaces of the comb-shaped electrodes 12a, 12b to the bottom of the cutout portion 34 (upper surface of the bonding layer 22). The lead-out wiring lines 14a, 14b are formed by a metal material such as Al, an Al—Cu alloy, Cu, Ru, Pt, Au, Ta, Ti, or Cr, for example. The external connecting terminals 15a, 15b are constituted of stud bumps, ball bumps, or wedge bumps made of Au, for example. As shown in FIG. 12, a base layer 16 such as a Ti/Au layer may be provided between the lead-out wiring lines 14a, 14b and the external connecting terminals 15a, 15b. This makes it possible to improve adhesion between the two elements.

The cutout portion 34 is formed to be deep enough to penetrate the piezoelectric substrate 11W. Therefore, from the cutout portion 34, the surface of a supporting member 320 (bonding layer 22), which is a base layer of the piezoelectric substrate 11W, is exposed. The external connecting terminals 15a, 15b are formed on the exposed surface of the supporting member 320, which makes it possible to decrease an external stress or mechanical impact acting on the piezoelectric substrate 11W upon fabricating the external connecting terminals 15a, 15b or upon mounting the device onto an external circuit substrate. As a result, it is possible to prevent the piezoelectric substrate 11W (11) from being damaged.

Typically, when a bonding tool (capillary) is used to make bumps as the external connecting terminals 15a, 15b, a pressing force is applied to the base substrate. In this embodiment, because the external connecting terminals 15a, 15b are supported by the supporting member 320 at the bottom of the cutout portion 34, the piezoelectric substrate 11W does not receive a load from the bonding tool upon making the external connecting terminals 15a, 15b, thereby making it possible to prevent the piezoelectric substrate 11W from being damaged.

Also, when the external connecting terminals 15a, 15b are mounted on an external circuit substrate by a flip-chip method, a pressing force from the chip mounter acts on the device. In this embodiment, because the external connecting terminals 15a, 15b are supported by the supporting member 320 at the bottom of the cutout portion 34, the load from the mounting can be prevented from directly acting on the piezoelectric substrate 11, thereby making it possible to prevent the piezoelectric substrate 11 from being damaged.

Embodiment 4

Figure 13:
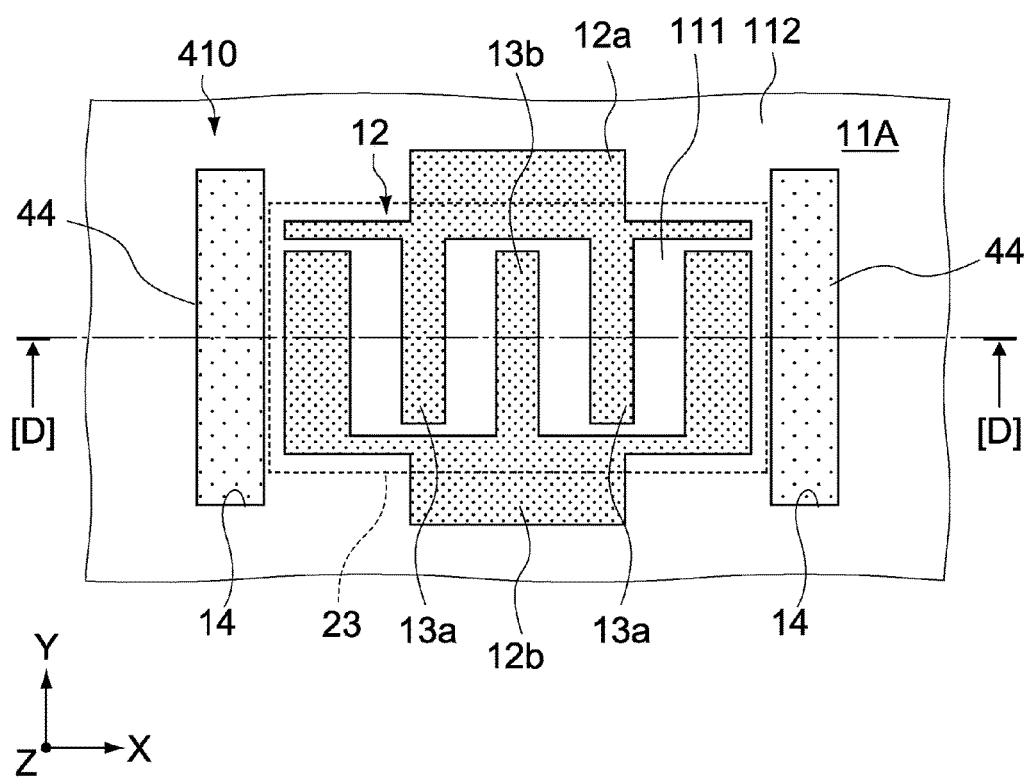
FIG. 13 is a schematic plan view showing a configuration of a Lamb wave device according to Embodiment 4 of the present invention.
Figure 14:
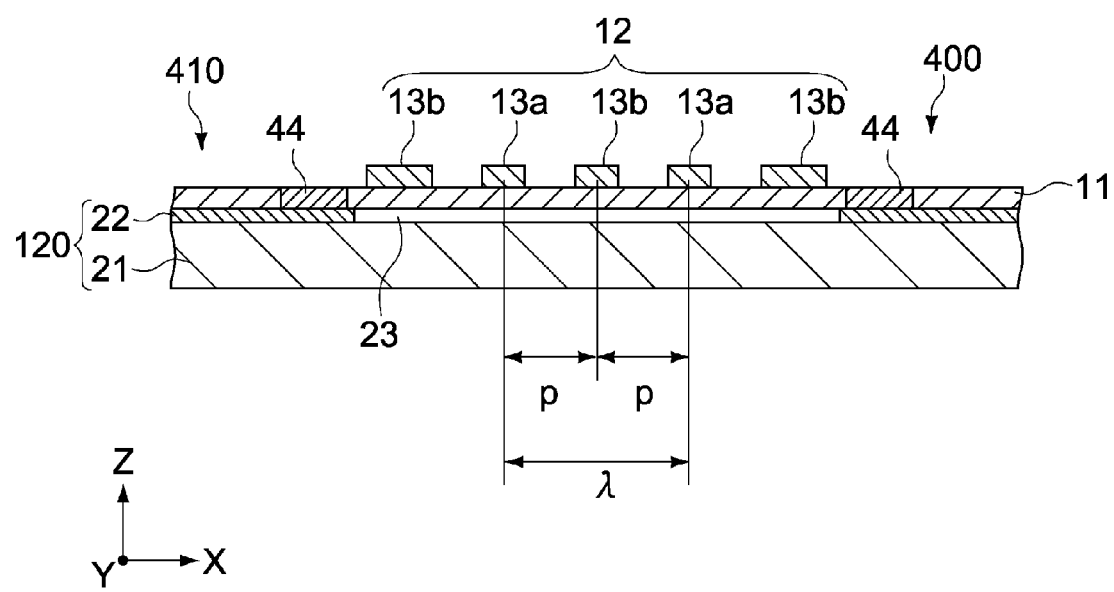
FIG. 14 is a cross-sectional view along the line D-D in FIG. 13.

FIGS. 13 and 14 are schematic diagrams showing a configuration of a Lamb wave device according to Embodiment 4. FIG. 13 is a plan view, and FIG. 14 is a cross-sectional view along the line D-D in FIG. 13. Below, differences from Embodiment 1 will be mainly explained. Configurations similar to those of the embodiments above are given similar reference characters, and descriptions thereof are omitted or simplified.

A Lamb wave device 400 of this embodiment differs from Embodiment 1 in that the cutout portion 14 is filled by a filler 44. With the Lamb wave device 400 of this embodiment, it is possible to suppress expansion or contraction of the piezoelectric substrate as a result of temperature change, and therefore, the effect of temperature to the resonance frequency is decreased.

As the filler 44, a material such as $SiO_2$ that has a smaller thermal expansion coefficient than that of the piezoelectric substrate 11 is used. When the piezoelectric substrate 11 is constituted of an LT substrate, the thermal expansion of the LT substrate as a result of thermal load can be decreased, and a change in characteristics due to temperature can be suppressed. As the filler 44, not only $SiO_2$, but also SiN or the like can be used.

Specifically, in this embodiment, the cutout portions 14 are disposed at both sides of the IDT electrodes 12, and the filler 44 is provided in the propagation direction of Lamb waves. This makes it possible to enhance the temperature compensation effect.

Figure 15A:
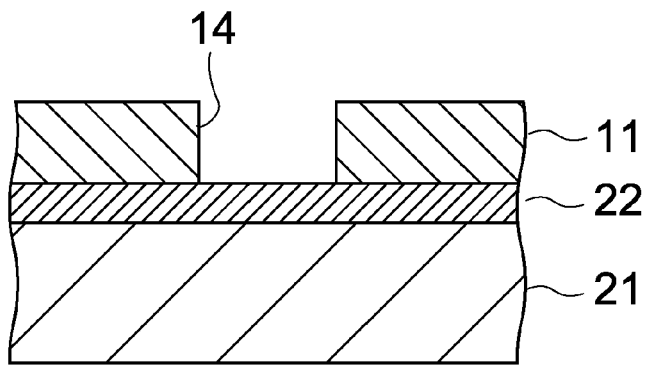
FIGS. 15A to 15C are cross-sectional views showing a fabrication process of a principal portion of the Lamb wave device.
Figure 15B:
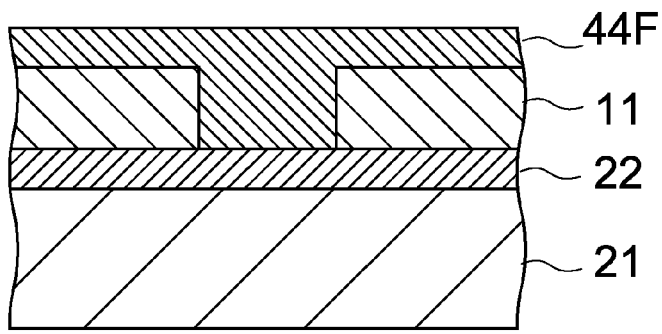
Figure 15C:
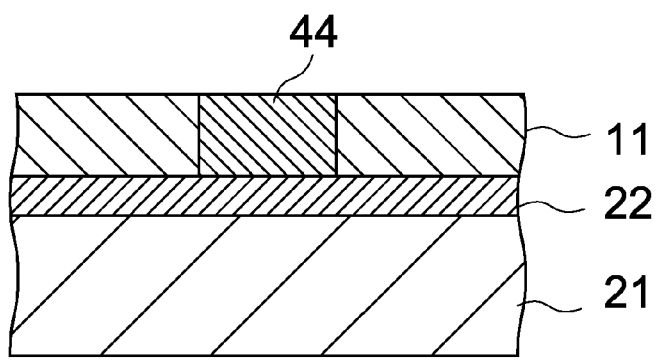

FIGS. 15A to 15C are schematic process diagrams illustrating a method of providing the filler 44 in the cutout portion 14. As shown in FIG. 15A, after the thickness of the piezoelectric substrate 11 is measured by using the cutout portion 14, an $SiO_2$ film 44F is formed on the entire surface of the piezoelectric substrate 11 (FIG. 15B). Thereafter, by polishing the surface of the piezoelectric substrate 11, the filler 44 embedded in the cutout portion 14 is obtained (FIG. 15C).

In Embodiments 3 and 4 above, the cutout portions 14, 34 provided to measure the thickness of the piezoelectric substrate 11 can be used for different purposes after forming the IDT electrodes 12. Also, the Lamb wave devices according to Embodiments 2 to 4 can be manufactured by a process similar to that in Embodiment 1.

The embodiments of the present invention have been described above, but the present invention is not limited to such embodiments. It is apparent that various modifications can be made without departing from the scope of the present invention.

For example, in the above embodiments, the supporting member that supports the piezoelectric substrate is constituted of the supporting substrate 21 and the bonding layer 22, but the present invention is not limited to this. It is also possible to employ device structures shown in FIGS. 16 and 17, for example.

Figure 16A:
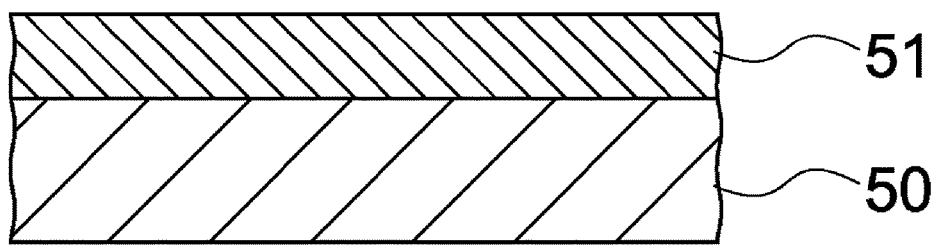
FIGS. 16A to 16F are process cross-sectional views illustrating a method of manufacturing a Lamb wave device of a modification example.
Figure 16B:
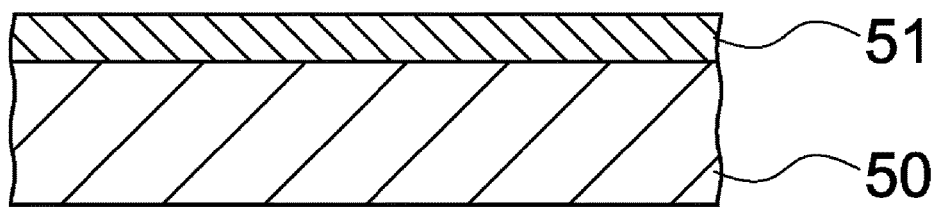
Figure 16C:
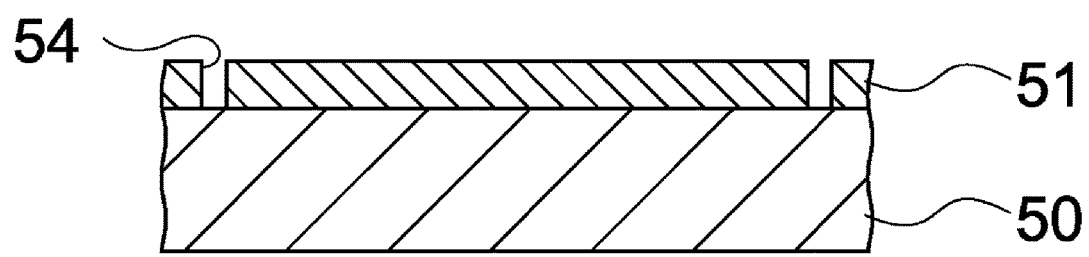
Figure 16D:
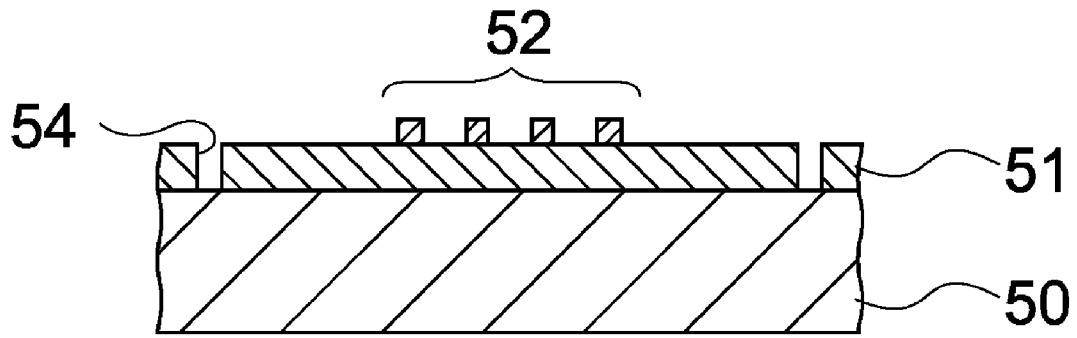
Figure 16E:
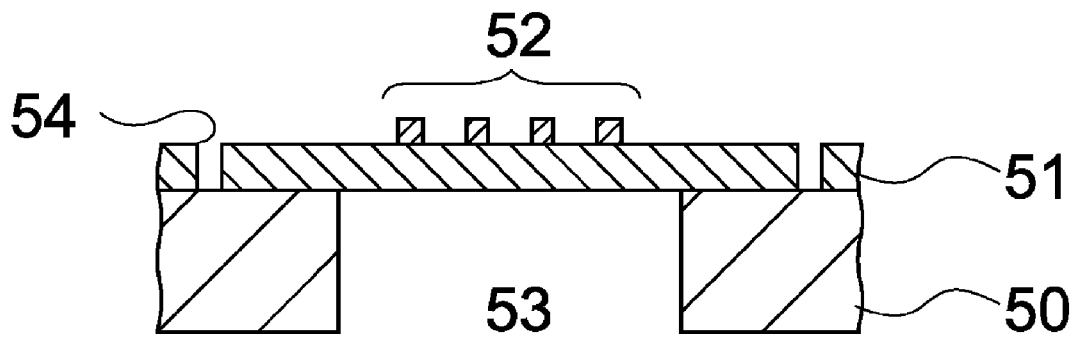
Figure 16F:
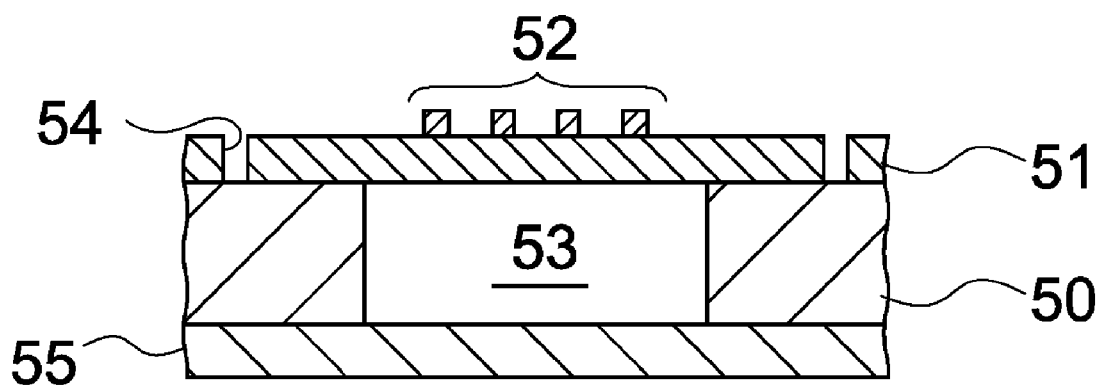

FIGS. 16A to 16F are schematic process cross-sectional views illustrating a method of manufacturing a Lamb wave device in which a cavity of the supporting member is constituted of a penetrating hole formed in the supporting substrate. After bonding a piezoelectric substrate 51 having a prescribed thickness on the upper surface of a supporting member 50, the piezoelectric substrate 51 is thinned to a prescribed thickness (FIGS. 16A and 16B). Next, cutout portions 54 for measuring the substrate thickness are formed at prescribed positions in the piezoelectric substrate 51, and thereafter, IDT electrodes 52 are formed with an electrode pitch that is adjusted in accordance with the measured thickness (FIGS. 16C and 16D). Next, a cavity 53 is formed in the supporting member 50 directly below the IDT electrodes 52, and thereafter, a cover 55 that covers the cavity 53 is bonded to the lower surface of the supporting member 50 (FIGS. 16E and 16F).

Figure 17A:
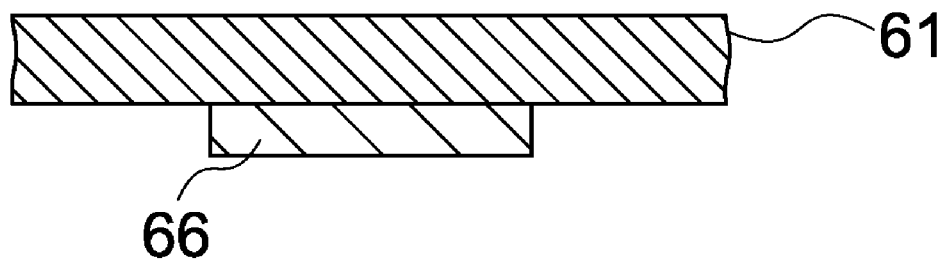
FIGS. 17A to 17F are process cross-sectional views illustrating a method of manufacturing a Lamb wave device of a modification example.
Figure 17B:
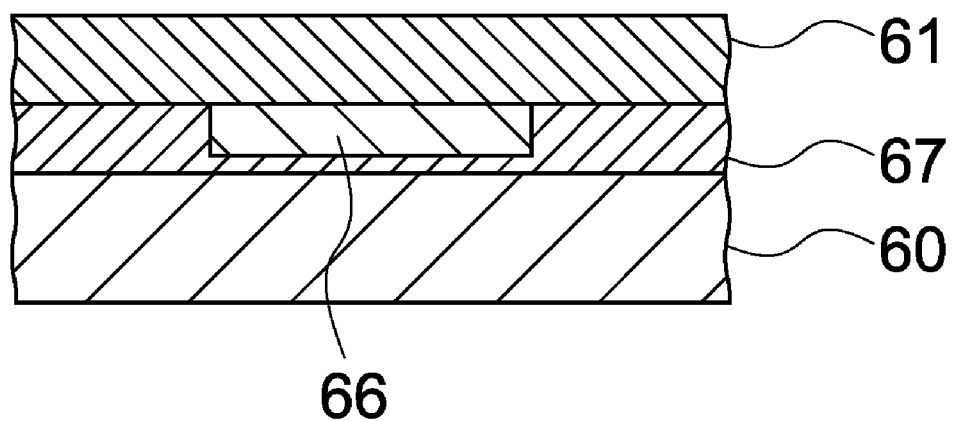
Figure 17C:
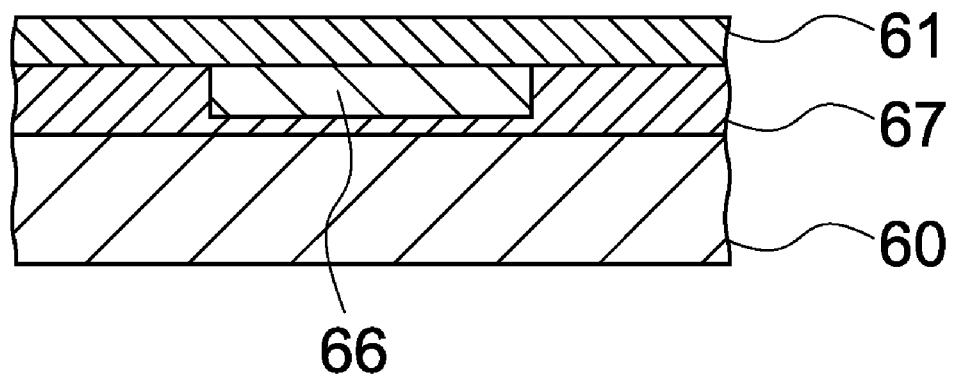
Figure 17D:
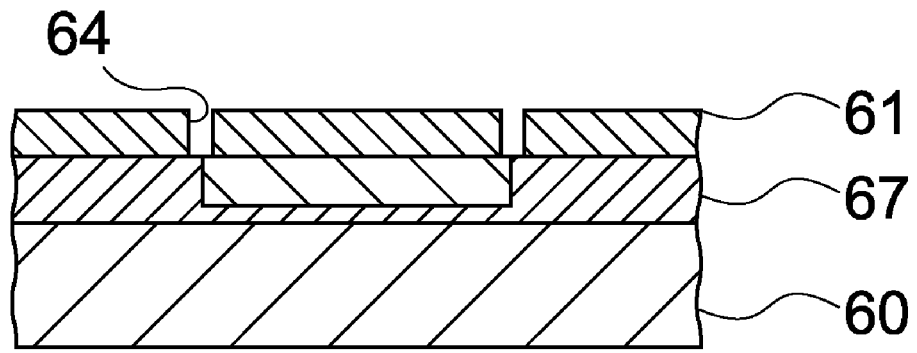
Figure 17E:
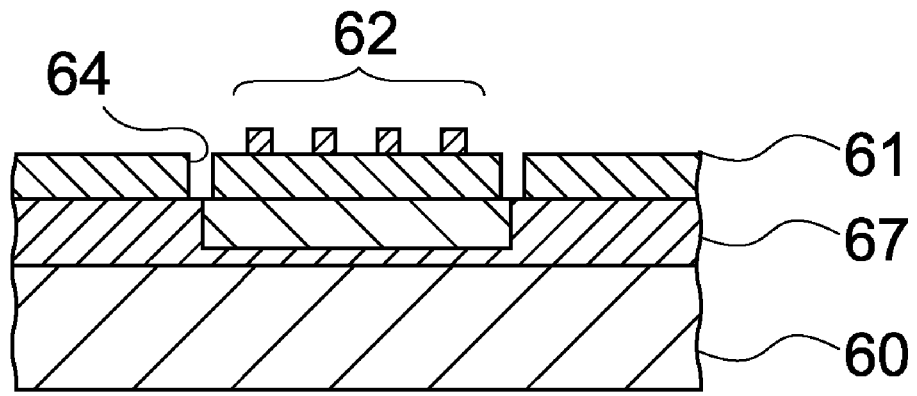
Figure 17F:
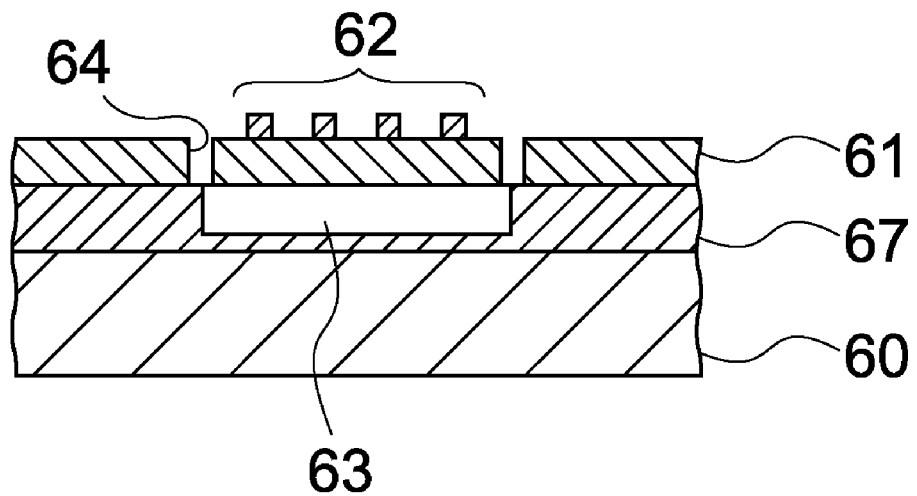

FIGS. 17A to 17F are schematic process cross-sectional views illustrating a method of manufacturing a Lamb wave device in which a cavity 63 is formed by providing a sacrificial layer 66 in a bonding layer 67 on the surface of a supporting substrate 60 and by thereafter removing the sacrificial layer 66 by dissolving it. The sacrificial layer 66 is formed on the lower surface of a piezoelectric substrate 61, and upon placing the piezoelectric substrate 61 onto the supporting substrate 60, the sacrificial layer 66 is embedded in the bonding layer 67 (FIGS. 17A and 17B). Next, after thinning the piezoelectric substrate 61 to a prescribed thickness, cutout portions 64 for measuring the substrate thickness are formed (FIGS. 17C and 17D). At this time, the cutout portions 64 are formed such that a part thereof reaches the sacrificial layer 66. After IDT electrodes 62 are formed based on the thickness of the piezoelectric substrate 61 measured by using the cutout portions 64, the sacrificial layer 66 is removed by dissolving it through the cutout portions 64 (FIGS. 17E and 17F).

Figure 18:
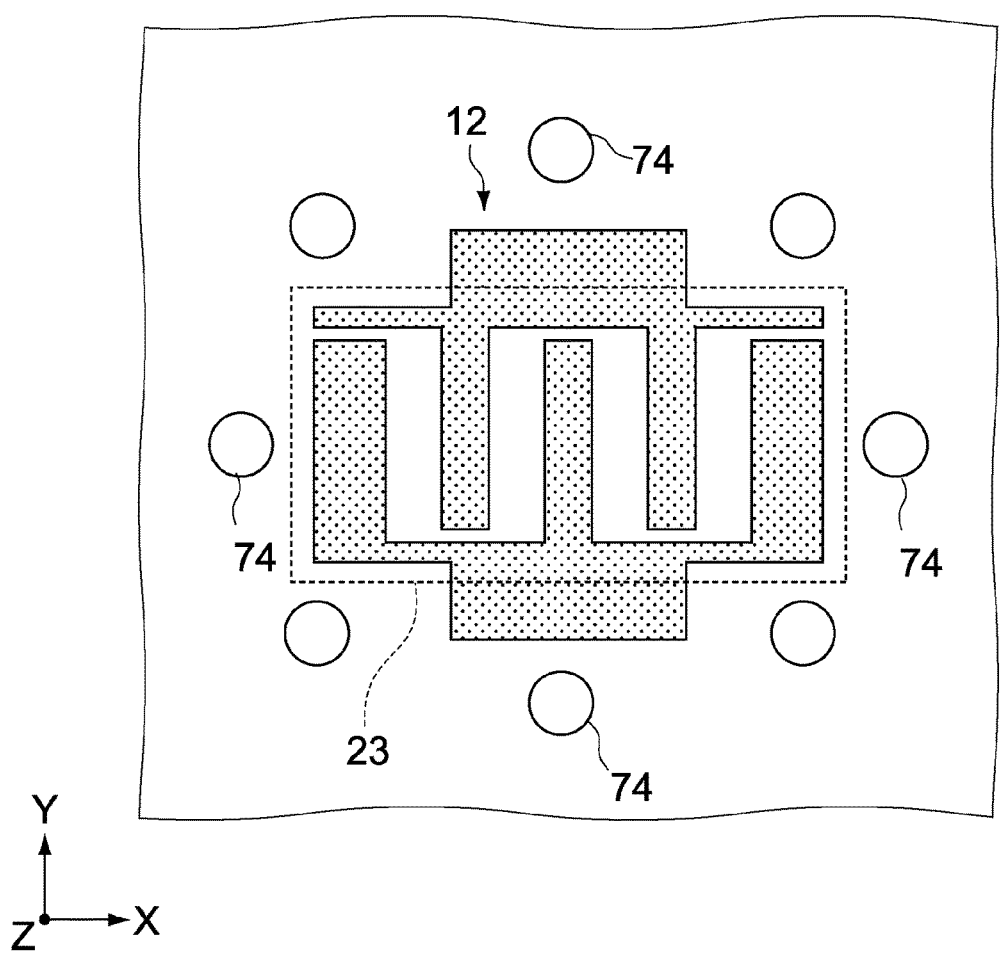
FIG. 18 is a plan view illustrating a schematic configuration of a Lamb wave device of a modification example.

As shown in FIG. 18, a plurality of circular cutout portions 74 may be formed around the IDT electrodes 12, and with this configuration, effects similar to those described above can be obtained.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A Lamb wave device, comprising:
   a piezoelectric function member that includes a piezoelectric substrate having a first surface and a second surface opposite to the first surface, and IDT electrodes disposed on the first surface, the piezoelectric substrate having a cutout portion therein; and
   a supporting member having a supporting surface that is bonded to the second surface of the piezoelectric substrate, and a cavity formed therein that faces the IDT electrodes through the piezoelectric substrate, the cavity being formed only in an area that substantially corresponds to the IDT electrodes thereabove,
   wherein the cutout portion penetrates the piezoelectric substrate to expose a portion of the supporting surface, and
   wherein an entirety of the second surface of the piezoelectric functional member except areas corresponding to the cavity and the cutout portion is directly bonded to the supporting surface of the supporting member without any wiring pattern interposed between the second surface of the piezoelectric functional member and the supporting surface of the supporting member so that the IDT electrodes excite the Lamb waves in said piezoelectric substrate supported by the supporting member as operational waves and so that a resonance frequency Fr of the Lamb wave device satisfies Fr=V/λ, where V is a phase velocity of the Lamb waves excited in the piezoelectric substrate and λ is a wavelength of the Lamb waves.

2. The Lamb wave device according to claim 1,
   wherein the first surface has a first region that faces the cavity and a second region that surrounds the first region,
   wherein the IDT electrodes are disposed in the first region, and
   wherein the cutout portion is disposed in the second region.

3. The Lamb wave device according to claim 1,
   wherein the cutout portion is a penetrating hole having a circular or rectangular opening.

4. The Lamb wave device according to claim 3,
   wherein the penetrating hole has an opening width of 30 μm or greater.

5. The Lamb wave device according to claim 1,
   wherein the cutout portion is a linear groove or recess.

6. The Lamb wave device according to claim 1,
   wherein a plurality of said cutout portions are provided, and
   wherein the plurality of said cutout portions are disposed at a plurality of positions in the piezoelectric substrate.

7. The Lamb wave device according to claim 1, further comprising an external connecting terminal that is disposed in the cutout portion and that is electrically connected to each of the IDT electrodes.

8. The Lamb wave device according to claim 1,
   wherein the piezoelectric function member further includes a filler layer provided to fill the cutout portion, and
   wherein the filler layer is made of a material that has a smaller thermal expansion coefficient than that of the piezoelectric substrate.

9. The Lamb wave device according to claim 1,
   wherein the supporting member includes a supporting substrate and a bonding material layer provided on the supporting substrate.

10. The Lamb wave device according to claim 1, wherein an electrode pitch of the IDT electrodes is set based on a measured actual depth of the cutout portion.

11. The Lamb wave device according to claim 8, wherein the filler is provided along a propagation direction of said Lamb waves.

12. The Lamb wave device according to claim 1, wherein a step surface of the cutout portion is a tapered surface.

13. The Lamb wave device according to claim 1, wherein the piezoelectric substrate includes the cutout portion in a plurality on the first surface, and the electrode pitch of the IDT electrodes is set based on measured depths of said plurality of cutout portions.

14. The Lamb wave device according to claim 13, wherein said plurality of cutout portions have shapes that are different from each other.

15. The Lamb wave device according to claim 1, wherein the cutout portion is formed around the IDT electrodes.

16. The Lamb wave device according to claim 1, wherein the piezoelectric substrate has the cutout portion at a boundary portion between the Lamb wave device and another Lamb wave device, and wherein the cutout portion connects an IDT electrode of the Lamb wave device with an IDT electrode of the other Lamb wave device.

17. The Lamb wave device according to claim 1, wherein the piezoelectric substrate includes two of the cutout portion such that a first cutout portion is formed at one side of the IDT electrodes and a second cutout portion is formed at another side of the IDT electrodes.

18. A Lamb wave device, comprising:
   a piezoelectric function member that includes a piezoelectric substrate having a first surface and a second surface opposite to the first surface, and IDT electrodes disposed on the first surface, the piezoelectric substrate having a cutout portion therein; and
   a supporting member having a supporting surface that is bonded to the second surface of the piezoelectric substrate, and a cavity formed therein that faces the IDT electrodes through the piezoelectric substrate, the cavity being formed only in an area that substantially corresponds to the IDT electrodes thereabove, wherein the cutout portion penetrates the piezoelectric substrate to expose a portion of the supporting surface to a degree that an actual thickness of the piezoelectric substrate can be measured through the cutout portion, and wherein a step surface of the cutout portion is a tapered surface, and wherein an entirety of the second surface of the piezoelectric functional member except areas corresponding to the cavity and the cutout portion is directly bonded to the supporting surface of the supporting member without any wiring pattern interposed between the second surface of the piezoelectric functional member and the supporting surface of the supporting member so that the IDT electrodes excite the Lamb waves in said piezoelectric substrate supported by the supporting member as operational waves and so that a resonance frequency Fr of the Lamb wave device satisfies $Fr=V/\lambda$, where V is a phase velocity of the Lamb waves excited in the piezoelectric substrate and $\lambda$ is a wavelength of the Lamb waves.

* * * * *